(12) United States Patent
Olesen

(10) Patent No.: US 7,835,151 B2
(45) Date of Patent: Nov. 16, 2010

(54) FLOW DISTRIBUTION MODULE AND A STACK OF FLOW DISTRIBUTION MODULES

(75) Inventor: Klaus Kristen Olesen, Soenderborg (DK)

(73) Assignee: Danfoss Silicon Power GmbH, Schleswig (DE)

( * ) Notice: Subject to any disclaimer, the term of this patent is extended or adjusted under 35 U.S.C. 154(b) by 586 days.

(21) Appl. No.: 11/719,766

(22) PCT Filed: Nov. 22, 2005

(86) PCT No.: PCT/DK2005/000746

§ 371 (c)(1),
(2), (4) Date: May 21, 2007

(87) PCT Pub. No.: WO2006/056199

PCT Pub. Date: Jun. 1, 2006

(65) Prior Publication Data

US 2009/0146293 A1    Jun. 11, 2009

(30) Foreign Application Priority Data

Nov. 24, 2004   (DK)   ............................. 2004 01832
Aug. 29, 2005   (DK)   ............................. 2005 01196

(51) Int. Cl.
*H05K 7/20*   (2006.01)
*H01L 23/36*   (2006.01)

(52) U.S. Cl. .................. 361/689; 361/679.53; 361/698; 361/699; 165/80.4; 165/121; 257/714; 62/259.2

(58) Field of Classification Search ............ 361/679.53, 361/688, 689, 698, 699, 702; 257/686, 714; 165/80.4, 80.5, 104.33, 185; 62/259.2
See application file for complete search history.

(56) References Cited

U.S. PATENT DOCUMENTS

| 3,648,113 | A | * | 3/1972 | Rathjen et al. | ............... 361/707 |
| 4,186,422 | A | * | 1/1980 | Laermer | ................... 361/689 |
| 4,420,739 | A | * | 12/1983 | Herren | ..................... 338/53 |
| 4,631,573 | A | * | 12/1986 | Sutrina | .................... 257/714 |
| 4,841,355 | A | * | 6/1989 | Parks | ...................... 257/686 |

(Continued)

FOREIGN PATENT DOCUMENTS

EP        0866315 A1     9/1998

(Continued)

OTHER PUBLICATIONS

International Search Report for PCT/DK2005/000746 dated Mar. 17, 2006.

*Primary Examiner*—Michael V Datskovskiy
(74) *Attorney, Agent, or Firm*—McCormick, Paulding & Huber LLP

(57) ABSTRACT

A flow distribution module (5) for distributing a flow of cooling fluid across a surface. Is adapted to be connected to another at least substantially identical module (5). Makes it possible to provide a cooling unit which may be customized to meet specific cooling needs without requiring special adaptation of the 'building blocks'. Thereby provides a flexible, yet simple, system. Furthermore a stack of flow distribution modules (5). Provides a very compact cooling unit when cooling is needed for several surfaces, no need for a cooling unit having a large surface area because the modules may be stacked in stead of positioned side-by-side.

7 Claims, 23 Drawing Sheets

U.S. PATENT DOCUMENTS

| | | | |
|---|---|---|---|
| 4,956,746 A * | 9/1990 | Gates et al. | 361/699 |
| 5,053,856 A * | 10/1991 | Davidson | 257/714 |
| 5,270,571 A * | 12/1993 | Parks et al. | 257/686 |
| 5,469,331 A * | 11/1995 | Conway et al. | 361/716 |
| 5,546,274 A * | 8/1996 | Davidson | 361/701 |
| 5,737,186 A | 4/1998 | Fuesser et al. | |
| 6,084,771 A * | 7/2000 | Ranchy et al. | 361/699 |
| 6,257,320 B1 | 7/2001 | Wargo | |
| 6,542,365 B2 * | 4/2003 | Inoue | 361/699 |
| 6,611,057 B2 | 8/2003 | Mikubo et al. | |
| 6,828,675 B2 * | 12/2004 | Memory et al. | 257/714 |
| 6,995,409 B2 | 2/2006 | Breit et al. | |
| 7,027,302 B2 * | 4/2006 | Inoue | 361/699 |
| 7,030,486 B1 * | 4/2006 | Marshall | 257/712 |
| 7,200,007 B2 | 4/2007 | Yasui et al. | |
| 7,231,960 B2 | 6/2007 | Sakai | |
| 7,245,493 B2 | 7/2007 | Inagaki et al. | |
| 7,360,582 B2 * | 4/2008 | Olesen | 165/80.4 |
| 7,571,759 B2 * | 8/2009 | Inagaki et al. | 165/80.4 |
| 2005/0121173 A1 | 6/2005 | Inagaki et al. | |
| 2005/0133210 A1 | 6/2005 | Inagaki et al. | |
| 2006/0096299 A1 | 5/2006 | Mamitsu et al. | |
| 2007/0044952 A1 | 3/2007 | Kuno et al. | |

FOREIGN PATENT DOCUMENTS

| | | |
|---|---|---|
| EP | 1113496 A1 | 7/2001 |
| EP | 1484797 A1 | 12/2004 |
| EP | 1657806 A2 | 5/2006 |
| JP | 2004095599 A | 3/2004 |
| WO | 02055942 A2 | 7/2002 |
| WO | 03095922 A2 | 11/2003 |
| WO | WO 03/095922 A2 * | 11/2003 |

* cited by examiner

FLOW DISTRIBUTION MODULE AND A STACK OF FLOW DISTRIBUTION MODULES

CROSS REFERENCE TO RELATED APPLICATIONS

This application is entitled to the benefit of and incorporates by reference essential subject matter disclosed in International Patent Application No. PCT/DK2005/000746 filed on Nov. 22, 2005; Danish Patent Application No. PA 2004 01832 filed Nov. 24, 2004; and Danish Patent Application No. PA 2005 01196 filed Aug. 29, 2005.

1. Field of the Invention

The present invention relates to a flow distribution module for distributing a flow of fluid over a surface to be cooled. It further relates to a stack of such flow distribution modules.

2. Background of the Invention

It is sometimes desirable to be able to cool a surface of a heat generating object. For example, semiconductor devices generate heat during their operation, and this heat acts to degrade the operation of the semiconductor device. For power semiconductor devices it is necessary to provide cooling during operation in order to maintain acceptable device performance, and for high power semiconductors liquid cooling is often applied.

To this end various cooling devices have previously been used. Thus, WO 02/055942 discloses a normal-flow heat exchanger (NFHX) utilizing a working fluid and having a high heat flux transfer capacity. The NFHX comprises an inlet manifold and an outlet manifold and a plurality of interconnecting channels. A flow of fluid is passed from the inlet manifold to the outlet manifold via the interconnecting channels in such a way that the fluid passes across a surface to be cooled.

The NFHX disclosed in WO 02/055942 is, however, only adapted to provide cooling to a single surface. Therefore, in case several surfaces need cooling, e.g. several semiconductor devices, each semiconductor device will have to be provided with a cooling device (e.g. the NFHX described in WO 02/055942). The semiconductor devices will in this case be positioned side-by-side, resulting in a device having a relatively large surface area. This is a disadvantage since such a device will be rather space consuming in two dimensions.

It is therefore desirable to provide a cooling unit which is capable of providing cooling for several surfaces while keeping the resulting device compact.

SUMMARY OF THE INVENTION

It is, thus, an object of the present invention to provide a cooling unit which is capable of providing cooling to several surfaces without resulting in a bulky device.

It is a further object of the present invention to provide a cooling unit which may be individually adapted to a specific cooling need without requiring specially manufactured parts.

It is an even further object of the present invention to provide a cooling unit which is simple to manufacture, yet being very flexible in terms of meeting specific demands or needs.

Thus, according to a first aspect of the present invention the above and other objects are fulfilled by providing a flow distribution module for distributing a flow of fluid over at least one surface to be cooled, the flow distribution module comprising:

a housing, an inlet manifold, an outlet manifold, a plurality of flow cells establishing one or more fluid connections between the inlet manifold and the outlet manifold, the flow cells being positioned in such a way that a flow of fluid passes along the surface(s) to be cooled when fluid flows from the inlet manifold to the outlet manifold via at least one flow cell, a substrate having one or more surfaces to be cooled, an inlet opening for providing fluid to the inlet manifold, and an outlet opening for leading fluid away from the outlet manifold, the flow distribution module being adapted to be connected to another at least substantially identical flow distribution module in such a manner that the inlet opening is connected to another at least substantially identical inlet opening to form a common fluid inlet, and in such a manner that the outlet opening is connected to another at least substantially identical outlet opening to form a common fluid outlet, the flow distribution module thereby being adapted to form part of a stack of flow distribution modules.

The surface(s) to be cooled may form part of or be thermally connected to a heat source, such as a semiconductor device, e.g. in an automotive application, or a central processing unit (CPU). The surface(s) to be cooled preferably is/are the surface(s) of the substrate.

The inlet manifold and the outlet manifold are adapted to deliver and receive respectively a fluid flow to/from the flow cells. Thereby fluid can pass from the inlet manifold, via one or more flow cells to the outlet manifold. The fluid flow passes along the surface(s) to be cooled, and the surface(s) is/are thereby cooled by means of the fluid.

The fluid may advantageously be a liquid, such as water or a mixture of ethylene-glycol and water for automotive applications where temperatures below 0° C. may occur. Alternatively, the fluid may be a two-phase cooling fluid, such as R134a which is commonly used in refrigerators and freezers.

The substrate is preferably of the kind which is adapted to carry one or more electrical components, i.e. a so-called component carrier. Thereby the flow distribution module is adapted to provide cooling for components carried by the substrate. The substrate may form part of a semiconductor device which produces heat and therefore needs cooling. Thus, the surface(s) to be cooled may form part of the flow distribution module. Alternatively, the surface(s) may be external to the module, i.e. the module may be adapted to be positioned in the vicinity of (preferably adjacent to) the surface(s).

The flow distribution module is adapted to be connected to another flow distribution module. The inlet opening is adapted to be connected to another inlet opening and the outlet opening is adapted to be connected to another outlet opening. Thereby a common fluid inlet and a common fluid outlet are formed when the flow distribution module is connected to another flow distribution module. Thus, two or more flow distribution modules may be assembled to form a stack of flow distribution modules, and fluid can readily be provided to each of the flow distribution modules of the stack, regardless of the number of modules in the stack, and without requiring any customization or additional parts in this regard. Thereby the flow distribution module of the invention may function as a 'building block' for a cooling unit. When a specific cooling need is present, a cooling unit may then be assembled according to the cooling need by simply choosing the number of flow distribution units to meet the cooling need. Thereby no special customization is necessary to design a cooling unit to meet a specific cooling need, and a very simple yet flexible system has thereby been provided.

Furthermore, the fact that the flow distribution module is adapted to be connected to another flow distribution module as described opens the possibility of stacking the modules, thereby providing cooling for several surfaces without having to increase the size of the resulting device considerably in one direction. As described above, the surface area of the device will typically increase considerably in prior art systems when several flow distribution modules or units are needed in order to meet the cooling need, because the modules/units have to be positioned side-by-side. But since the flow distribution module of the present invention is adapted to be connected to another flow distribution module in such a way that a stack of flow distribution modules is formed, all the modules need not be positioned side-by-side, but can instead be positioned one on top of the other, thereby providing a very compact cooling unit. This is very advantageous. Furthermore, this opens the possibility of providing parallel cooling in three dimensions, i.e. flow cells may be connected in parallel between an inlet manifold and an outlet manifold in three dimensions. This is advantageous because it reduces temperature gradients.

The other flow distribution module is preferably also a flow distribution module according to the present invention, and the flow distribution modules of the resulting stack are most preferably identical. However, the modules may alternatively differ from each other, e.g. in order to meet specific cooling needs of different surfaces. It should be noted, however, that the differences between the modules should not be of such a character so as to prevent them being connected.

In a preferred embodiment the plurality of flow cells are connected in parallel between the manifolds. In this embodiment each of the flow cells establishes a fluid connection between the inlet manifold and the outlet manifold. Thus, fluid from the inlet manifold will flow simultaneously via the flow cells to the outlet manifold. Thereby the surface(s) is/are cooled in such a way that temperature gradients across the surface(s) are eliminated, or at least considerably reduced.

Alternatively, some or all of the flow cells may be serially connected.

Each flow channel may be formed to cause a plurality of changes in the direction of flow of the fluid flowing along the surface(s). This is advantageous because it causes turbulence, but even in the laminar flow regime the directional changes in the flow pattern of the fluid within the flow cells will result in an increased heat transfer. Fluid which has been heated by passing closely along the surface(s) to be cooled will be effectively mixed with colder fluid which has not passed along the surface(s) to be cooled. This ensures that the full heat capacity of the fluid is put to use in the cooling process.

Preferably, at least the housing, the inlet manifold, the outlet manifold and the plurality of flow cells form a single piece. This is very advantageous from a manufacturing point of view, since it allows at least the housing, the manifolds and the flow cells to be manufactured in a single manufacturing step. This makes the flow distribution module very suitable for mass production.

The substrate may be mounted in a cavity which is formed in the housing. In this case the housing of the flow distribution module is preferably adapted to be connected to the housing of another flow distribution module. Thereby the modules can be connected independently of any properties of the substrate. When mounted in the cavity, an outer part of the substrate may flush with one or more outer parts of the housing so as to form a substantially common surface. The substantially common surface may form an interface to another flow distribution module. In this case the outer part of the substrate may be a surface to be cooled, and the surface may be cooled by means of an adjacent module.

The substrate and the housing may have been assembled in a substantially fluid tight manner. This is particularly advantageous in case an outer part of the substrate and one or more outer parts of the housing form a substantially common surface as described above. The substrate and housing may, e.g. be assembled using a silicon adhesive and/or one or more o-rings. The o-ring(s) may, e.g., be formed using a two-component moulding technology. In this case the o-ring(s) may be formed directly into the housing or the substrate. After silicon adhesive or o-ring(s) has/have been applied the housing and the substrate may advantageously be subject to a substantially constant force pressing the two parts towards each other. Such a substantially constant force may, e.g., be provided by a spring or a clamp applied to the module. The term 'substantially fluid tight' should, in the present context, be interpreted to mean at least substantially preventing the fluid which is used in the flow distribution module from leaking from the assembly.

According to another embodiment the substrate may form an integral part of the housing, and at least the plurality of flow cells may be mounted in a cavity which is formed in the housing. In this embodiment the substrate may be encapsulated in a material, e.g. a plastic material, the encapsulation forming the housing with the cavity therein. The flow cells are then preferably formed in a separate baffle which fits into the cavity. The baffle may either be shaped and positioned in such a way that the flow cells are able to distribute a flow of fluid over a surface of the substrate forming an integral part of the housing, or it may be shaped and positioned in such a way that the flow cells are able to distribute a flow of fluid over a surface of a substrate forming an integral part of the housing of a neighbouring flow distribution module.

The inlet manifold and the outlet manifold may further be mounted in the cavity, e.g. forming part of the baffle.

The flow distribution module may be adapted to be connected to another at least substantially identical flow distribution module via one or more substrates, each substrate having one or more surfaces to be cooled. In this case the housing of the flow distribution module is adapted to be connected to a substrate. This substrate may then be connected to another substrate or to another flow distribution module. Thereby a 'sandwich' is provided with flow distribution modules positioned substantially opposite each other with one or more substrates positioned between the flow distribution modules. Furthermore, a stack of flow distribution modules may be formed by two or more of such 'sandwiches'. Alternatively or additionally, two or more 'sandwiches' may be positioned side-by-side.

At least one substrate may be a Direct Copper Bonding (DCB) substrate. Alternatively or additionally, one or more substrates may be any other suitable kind of substrate, such as an Insulated Metal Substrate (IMS) or a thickfilm or other ceramic based substrates.

The housing of the flow distribution module may comprise a first side being adapted to accommodate a surface to be cooled and a second side being arranged at least substantially opposite to the first side, the second side having at least the plurality of flow cells formed therein, the plurality of flow cells thereby being adapted to provide a flow of fluid across a surface to be cooled which is accommodated in the first side of a neighbour flow distribution module. In this embodiment a resulting stack of flow distribution modules functions in such a way that one module holds a surface to be cooled and the cooling for the surface is provided by a neighbouring module. This configuration of the flow distribution module makes the module very suitable for mass production since it may be manufactured in a single piece where the surface may be positioned at one side, and the other side has the flow cells manufactured therein, so that another surface being accommodated by an adjacently positioned module may be cooled by means of fluid flowing through the flow cells. This configuration also makes it very easy to assemble a stack of flow distribution modules, and it makes it easy to position or replace the surfaces to be cooled.

In one embodiment the second side may further have the inlet manifold and the outlet manifold formed therein, thereby making the flow distribution module even more suitable for mass production.

According to another embodiment the housing may comprise a first side with a surface to be cooled forming an integral part thereof and a second side being adapted to accommodate a baffle having at least the plurality of flow cells formed therein, the plurality of flow cells thereby being adapted to provide a flow of fluid across a surface to be cooled which forms an integral part of the first side of a neighbouring flow distribution module. The baffle may further have the inlet manifold and the outlet manifold formed therein.

According to a second aspect of the present invention, the above and other objects are fulfilled by providing a stack of flow distribution modules, each flow distribution module of the stack being a flow distribution module according to the first aspect of the invention.

As mentioned above, such a stack of flow distribution modules is very advantageous because it provides a cooling unit which is very simple, yet very flexible, since it may easily be adapted to meet a specific cooling need without requiring special customization of the individual 'building blocks'.

The flow distribution modules may be assembled by means of a number of fastening means, such as one or more screws, and/or by means of silicone adhesive. Furthermore, the flow distribution modules may be assembled using one or more o-rings like the ones described above. As described above in connection with the substantially fluid tight assembly of the housing and the substrate, the modules may be subject to a substantially constant force pressing the modules towards each other. Such a force may, e.g., be provided by a spring or a clamp applied to the stack of modules.

The stack of flow distribution modules may further comprise a common fluid inlet for providing fluid to the inlet manifolds of the flow distribution modules, and a common fluid outlet for receiving fluid from the outlet manifolds of the flow distribution modules. In this case the common fluid inlet is formed by inlet openings of the flow distribution modules, and the common fluid outlet is formed by outlet openings of the flow distribution modules. In this embodiment fluid is provided to all of the modules via the common fluid inlet, and after the fluid has passed through the flow cells to the outlet manifolds, it is led away from the stack via the common fluid outlet. Thereby only one external connection to a fluid source is needed in order to provide fluid to all the flow distribution modules of the stack.

The flow distribution modules may advantageously be connected in parallel between the common fluid inlet and the common fluid outlet. Thereby the cooling of the surfaces corresponding to various flow distribution modules is provided in such a way that temperature gradients are eliminated or at least considerably reduced. This is very similar to the situation described above in relation to the flow cells of one module being connected in parallel between the manifolds. In a preferred embodiment the flow cells of each module as well as the modules are connected in parallel. In this embodiment temperature gradients in two dimensions may be eliminated or at least considerably reduced, thereby providing a very uniform cooling.

At least two flow distribution modules may have been connected via one or more substrates. This has already been described in detail above.

At least two modules may have been connected in such a way that the substrates face each other. In this embodiment the stack may be assembled in a 'housing, substrate, substrate, housing' structure. Alternatively, the stack may comprise alternating housings and substrates.

According to one embodiment at least two flow distribution modules may have been connected directly to each other in such a way that a substrate forming part of a standard component is retained by two flow distribution modules. In this embodiment a 'sandwich structure' is formed with alternating flow distribution modules and standard components. The flow distribution modules should, in this case, be manufactured in such a way that a desired standard component will fit between two flow distribution modules. This embodiment is advantageous because it allows for simultaneously providing cooling to a number of standard components without having to consider cooling when the standard components are manufactured. The necessary adaptation is instead made to the flow distribution modules. This is an advantage because the tooling for manufacturing the standard components is normally more expensive than the tooling for manufacturing the flow distribution modules, and it is therefore desirable to be able to use the same tooling for manufacturing the standard components, regardless of the intended use of the resulting components.

BRIEF DESCRIPTION OF THE DRAWINGS

The invention will now be described with reference to the accompanying drawings in which.

DETAILED DESCRIPTION OF THE INVENTION

Figure 1:
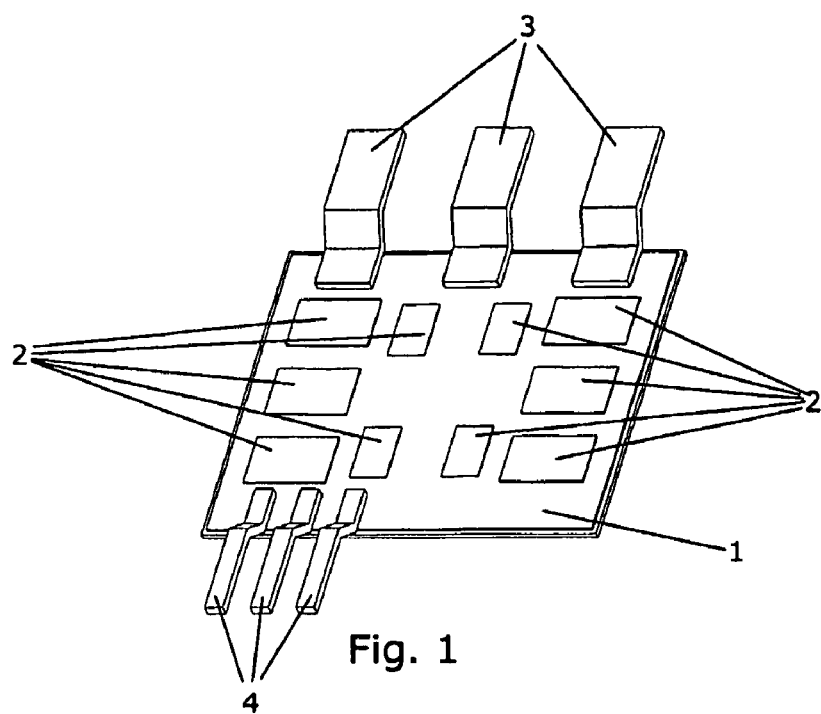
FIG. 1 shows a Direct Copper Bonding (DCB) structure.

FIG. 1 shows a DCB substrate 1 having a number of components 2 positioned thereon. The components 2 may, e.g. include Integrated Gate Bipolar Transistors (IGBT's) and/or diodes. The DCB substrate 1 is further provided with three power terminals 3 and three control terminals 4. The terminals 3, 4 shown in the Figure have been soldered or welded to the substrate 1. Alternatively, terminals 3, 4 could be attached to the substrate 1 by means of wire bonding or by means of any other suitable technique for attaching terminals to a substrate.

Figure 2:
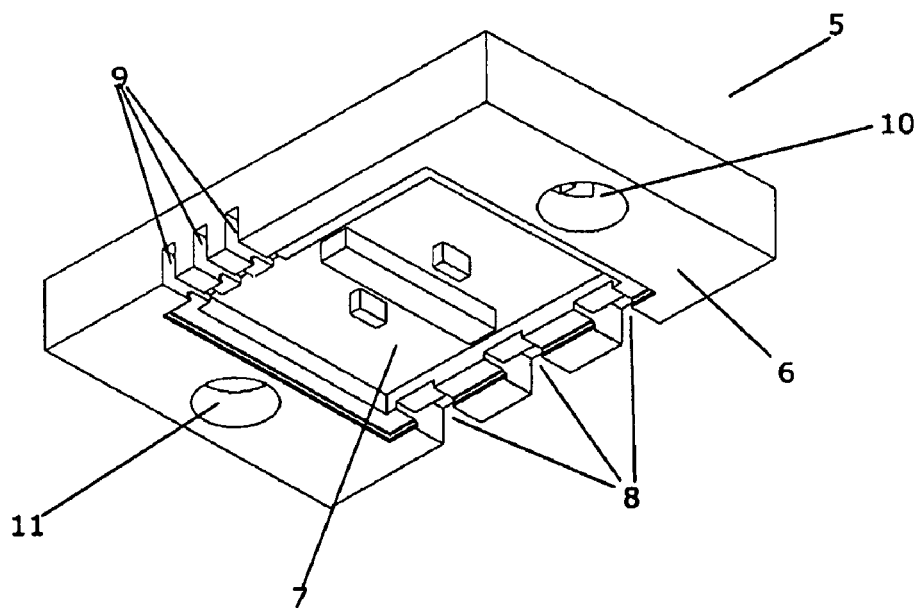
FIG. 2 shows a housing having a cavity adapted to accommodate the substrate shown in FIG. 1.

FIG. 2 shows a flow distribution module 5 with a housing 6 having a cavity 7 formed therein. The cavity 7 is adapted to accommodate a substrate 1 as the one shown in FIG. 1. Thus, the housing 6 is provided with three holes 8 for accommodating the power terminals 3 and three holes 9 for accommodating the control terminals 4. The housing 6 is further provided with an inlet opening 10 for providing fluid to the flow distribution module 5, and an outlet opening 11 for leading fluid away from the flow distribution module 5. This will be described further below.

Figure 3:
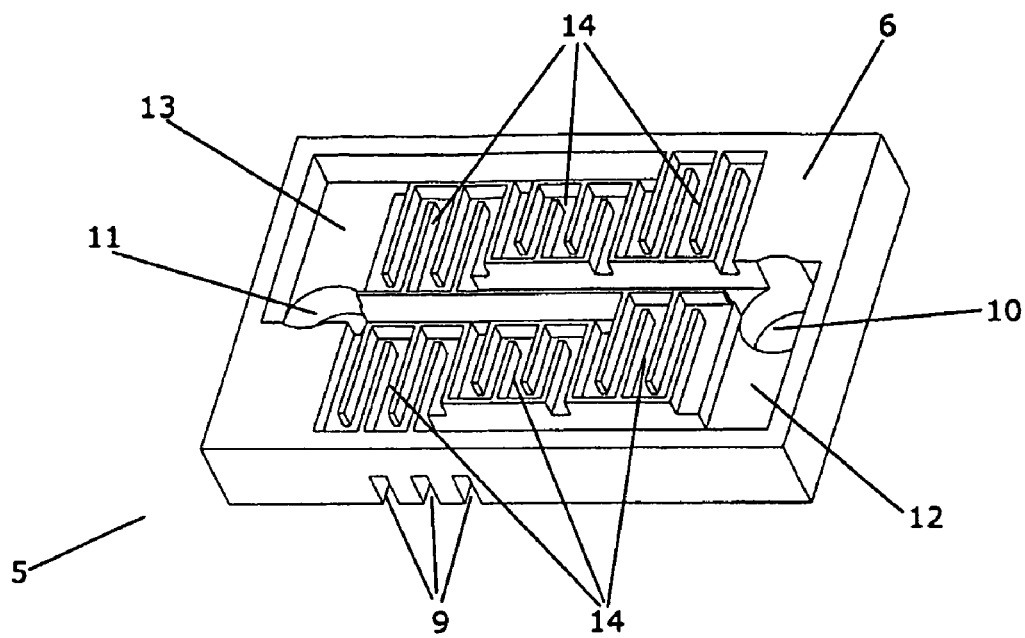
FIG. 3 shows a housing having an inlet manifold, an outlet manifold and a plurality of flow cells formed therein.

FIG. 3 shows the flow distribution module 5 of FIG. 2, but seen from the opposite side. An inlet manifold 12 and an outlet manifold 13 are formed in the housing 6. Six flow cells 14 (also formed in the housing 6) each establishes a fluid connection between the inlet manifold 12 and the outlet manifold 13. The flow cells 14 are connected in parallel between the manifolds 12, 13. Thereby fluid entering the inlet manifold 12 via the inlet opening 10 will flow via the flow cells 14 to the outlet manifold 13, and from there the fluid will leave the module 5 via the outlet opening 11.

Figure 4:
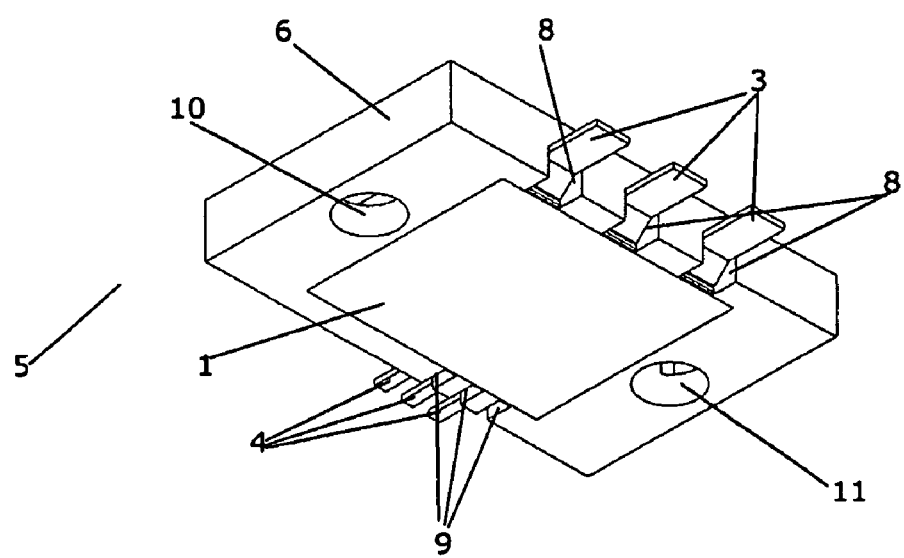
FIG. 4 shows a flow distribution module with a substrate accommodated therein.

FIG. 4 shows the flow distribution module 5 of FIG. 2 having the DCB substrate 1 of FIG. 1 accommodated in the cavity (not visible in FIG. 4). It can be seen that the power terminals 3 fit in the holes 8, and that the control terminals 4 fit in the holes 9 in such a manner that the terminals 3, 4 protrude from the module 5 when the DCB substrate 1 is accommodated in the cavity of the housing 6. Thereby the terminals 3, 4 can provide external connections, e.g. for providing power to the components of the substrate or for controlling the components.

Figure 5:
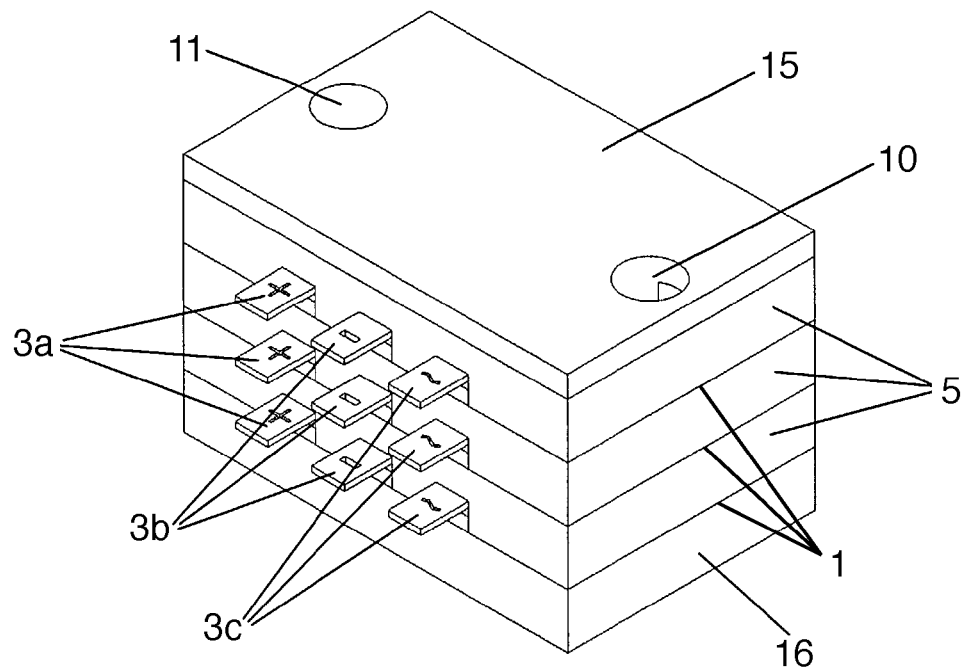
FIG. 5 shows a stack of three flow distribution modules.

FIG. 5 shows a stack of three flow distribution modules 5. The stack is ended by a lid 15 at one end and a lower part 16 at an opposite end. The lid 15 has an inlet opening 10 and an outlet opening 11 formed therein. Thereby fluid may be provided to all the flow distribution modules 5 of the stack through the inlet opening 10. Correspondingly, fluid which has passed through the flow distribution modules 5 is collected and led away from the stack through the outlet opening 11.

Each module 5 comprises a half bridge, and the stack of three modules 5 therefore constitutes a three-phase module. From each flow distribution module 5 a first 3a, a second 3b and a third 3c terminal protrudes. The first terminals 3a are adapted to be connected to a positive pole of a power supply, the second terminals 3b are adapted to be connected to a negative pole of a power supply, and each of the third terminals 3c provides a phase of the three-phase module. All of the first terminals 3a may be commonly connected, e.g. to a bus bar. Similarly, all the second terminals 3b may be commonly connected.

Figure 6:
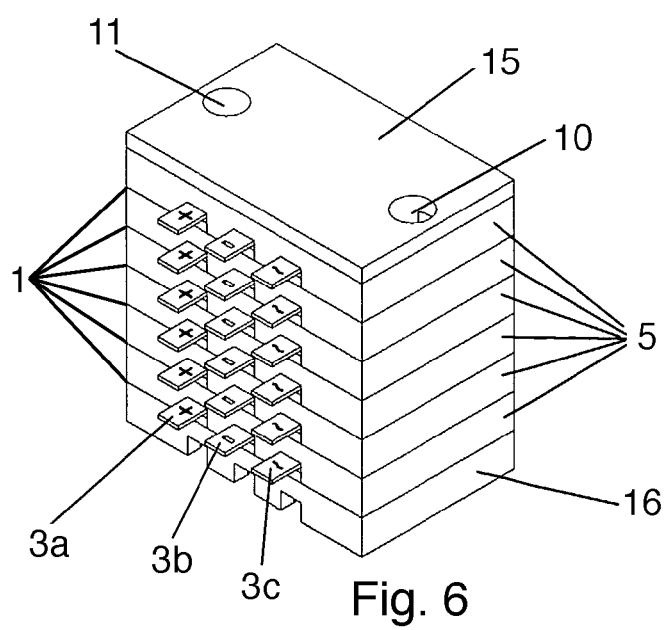
FIG. 6 shows a stack of six flow distribution modules.
Figure 7:
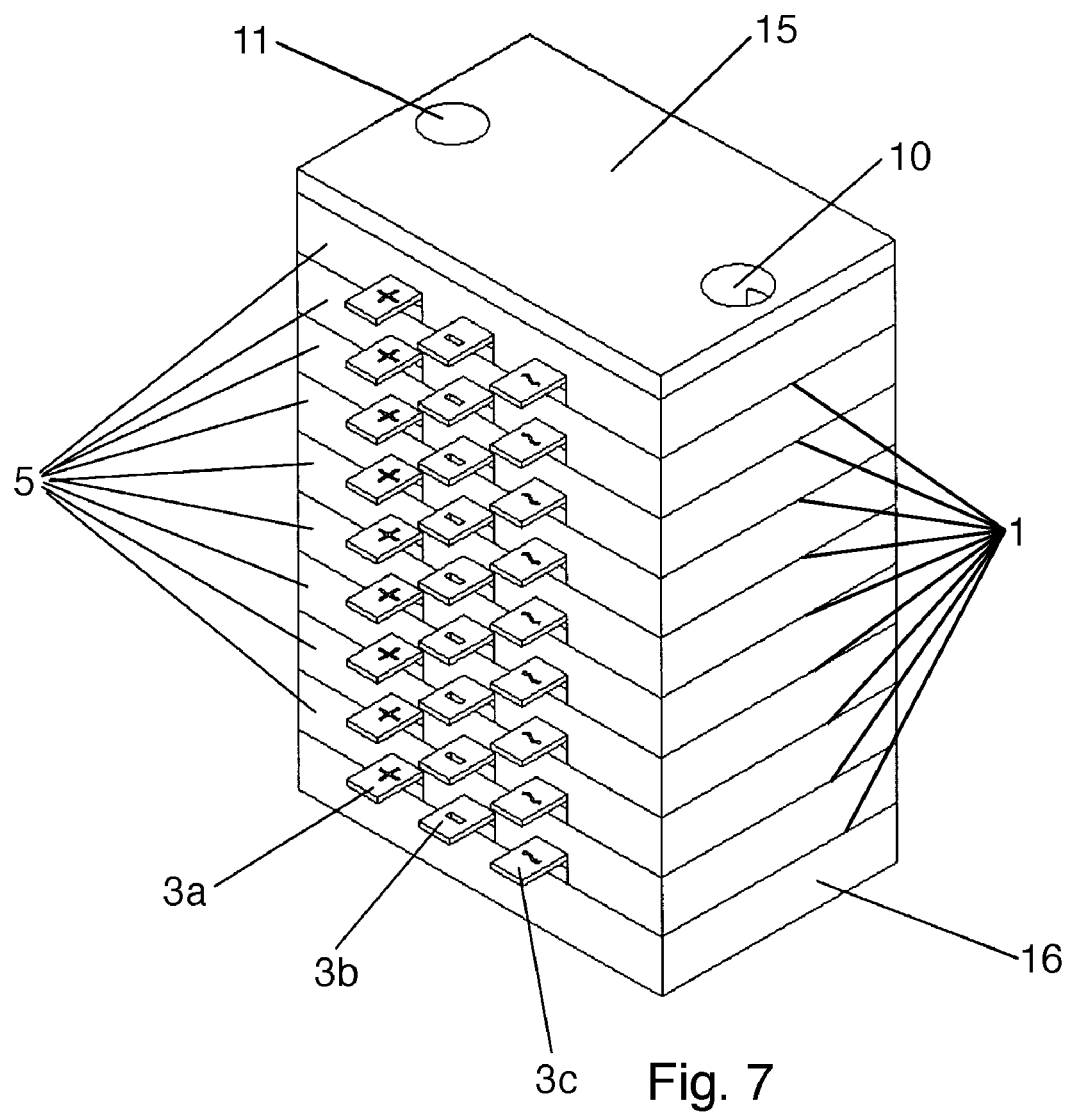
FIG. 7 shows a stack of nine flow distribution modules.
Figure 8:
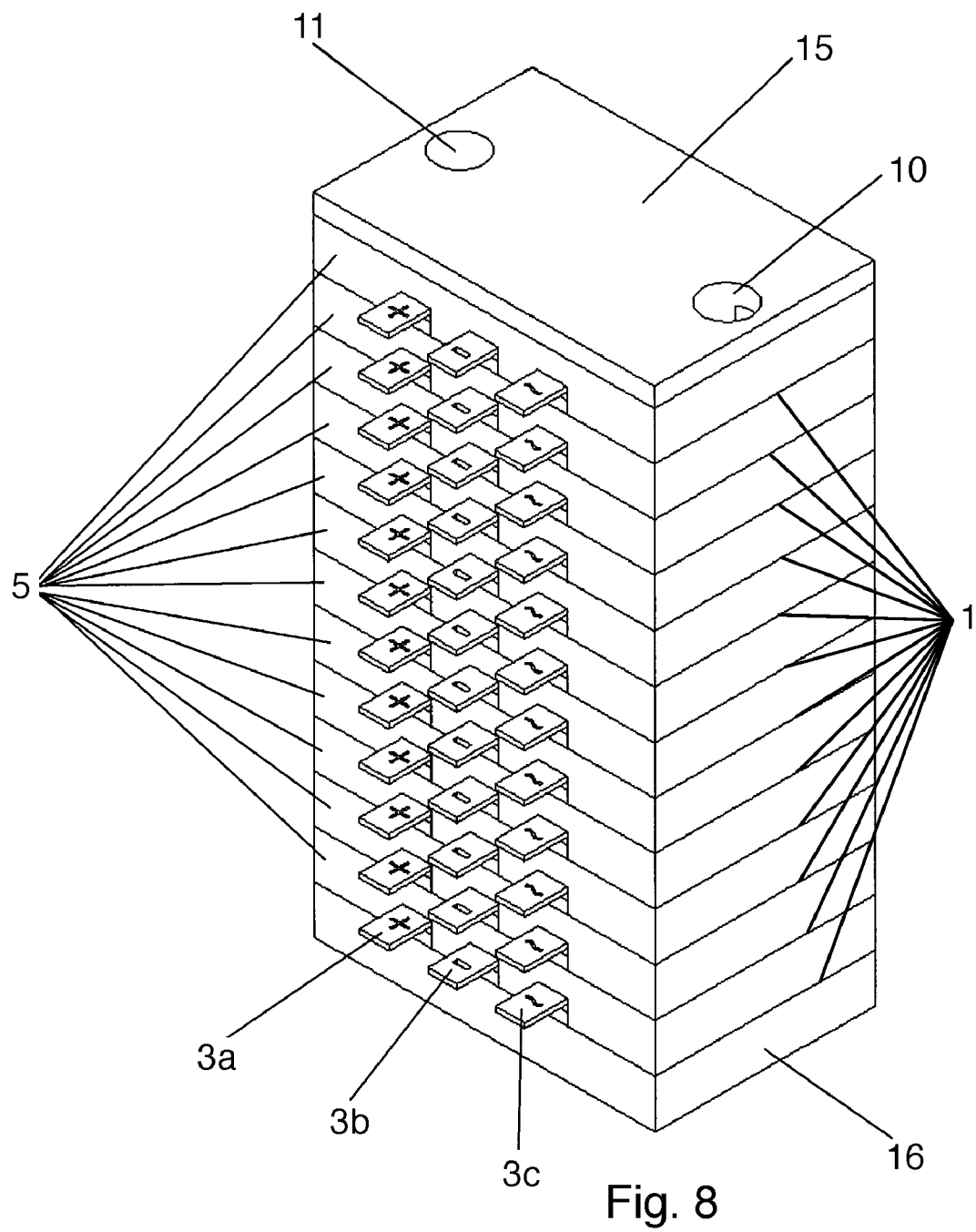
FIG. 8 shows a stack of twelve flow distribution modules.

FIGS. 6-8 show stacks of flow distribution modules 5 similar to the one shown in FIG. 5. In FIG. 6 the stack comprises six flow distribution modules 5, in FIG. 7 the stack comprises nine flow distribution modules 5, and in FIG. 8 the stack comprises twelve flow distribution modules 5. All the remarks set forth when describing the stack of FIG. 5 are equally applicable for the stacks of FIGS. 6-8.

Turning now to FIG. 6, the half bridges of the six flow distribution modules 5 may be connected two-by-two in parallel, thereby creating a three-phase module, each phase being provided by the half bridges of two flow distribution modules 5.

Similarly, the stacks of FIGS. 7 and 8 form three-phase modules by connecting the phases of the half-bridges three-by-three or four-by-four, respectively.

Figure 9:
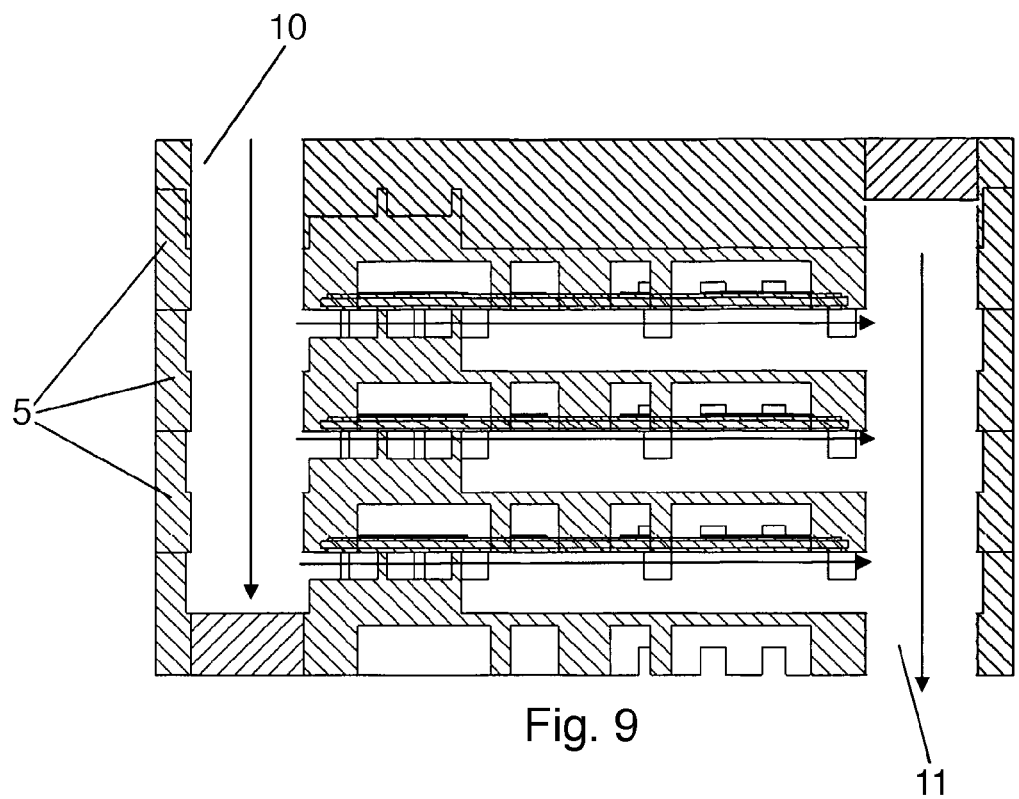
FIGS. 9 and 10 show cross sections of a stack of three flow distribution modules having a common inlet and a common outlet being arranged in two different ways.

FIG. 9 shows a cross section of a stack of three flow distribution modules 5 according to one embodiment of the invention. The Figure illustrates the fluid flow through the stack. The flow distribution modules 5 are connected in parallel between an inlet opening 10 and an outlet opening 11 being positioned at opposite ends of the stack. Fluid enters the stack via the inlet opening 10, as indicated by the arrow pointing downwardly, and passes through the flow cells of the flow distribution modules 5. This is indicated by the horizontal arrows. Subsequently, the fluid is collected and leaves the stack via the outlet opening 11. Thus, fluid may be provided to all the flow distribution modules 5 by connecting the inlet opening 10 to a fluid source and connecting the outlet opening 11 to a fluid reservoir for collecting the used fluid. In the embodiment shown in FIG. 9 the two connections should be positioned at opposite sides of the stack.

Figure 10:
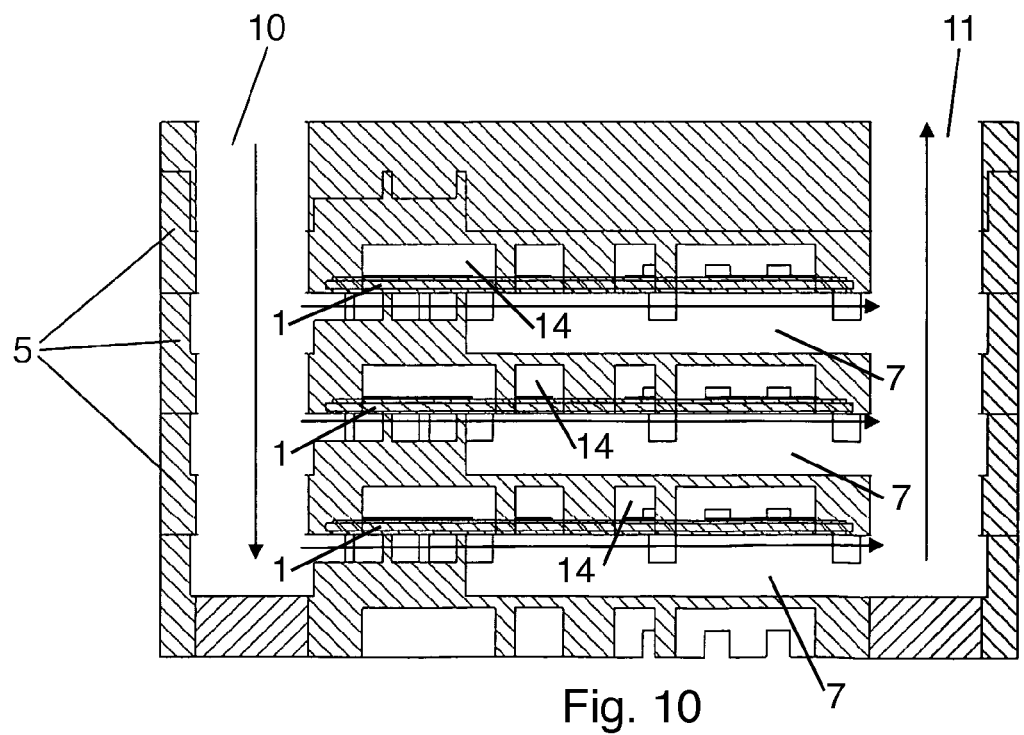

FIG. 10 shows a cross section of a stack of flow distribution modules 5 according to another embodiment of the invention. All the remarks set forth above when describing the stack of FIG. 9 are equally applicable here, except that in the embodiment shown in FIG. 10 the inlet opening 10 and the outlet opening 11 are positioned at the same side of the stack, and the connections to the fluid source and the reservoir should therefore also be positioned at the same side.

Figure 11:
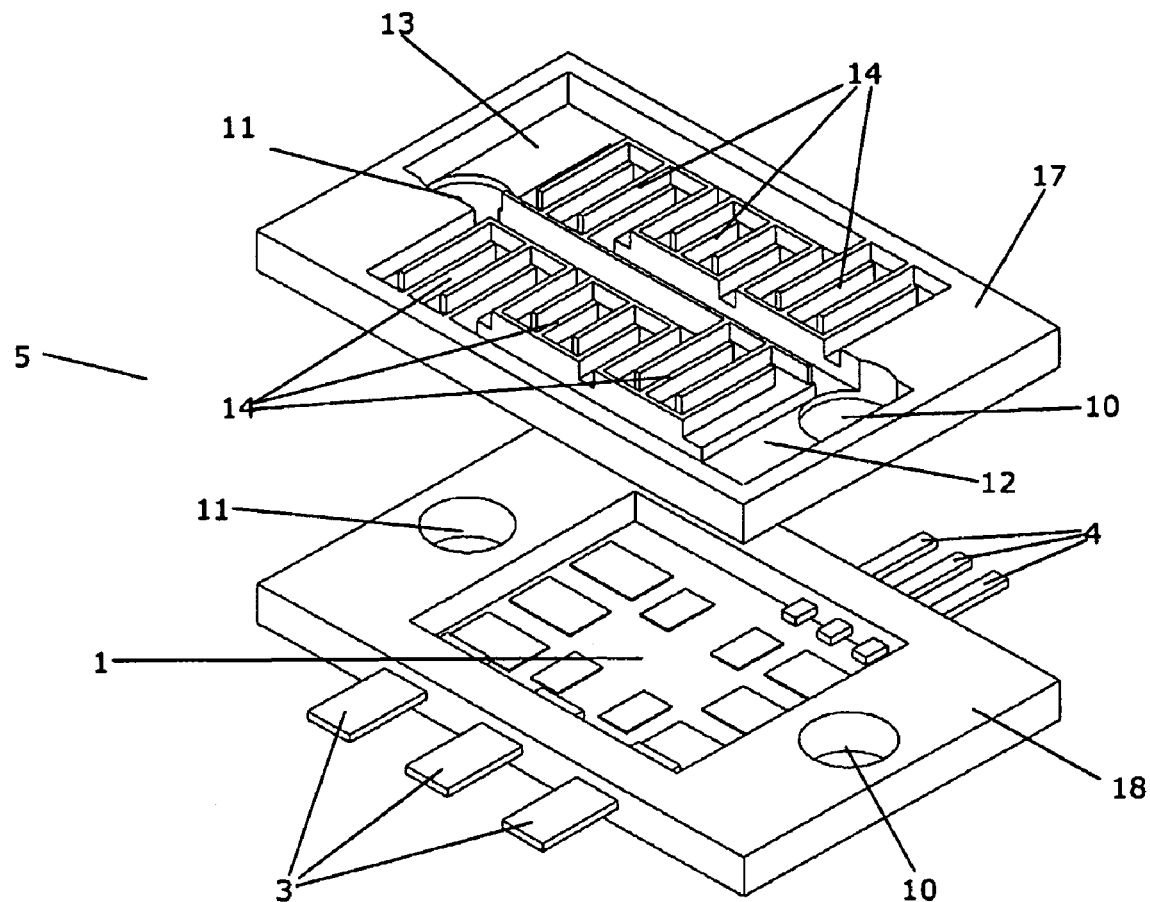
FIG. 11 is an exploded view of a housing being formed by two detachable parts.

FIG. 11 shows an exploded view of a flow distribution module 5 having a first part 17 having an inlet opening 10, an outlet opening 11, an inlet manifold 12 and an outlet manifold 13 formed therein. Six flow cells 14 are connected in parallel between the inlet manifold 12 and the outlet manifold 13. The flow distribution module 5 further comprises a second part 18 having a DCB substrate 1 mounted thereon. Three power terminals 3 and three control terminals 4 protrude from the second part 18 of the flow distribution module 5. The second part 18 also has an inlet opening 10 and an outlet opening 11 formed therein. The first part 17 and the second part 18 are adapted to be assembled, thereby forming the flow distribution module 5. When the flow distribution module 5 is assembled, the inlet openings 10 and the outlet openings 11 form through-going bores being adapted to establish a common fluid supply to a number of flow distribution modules 5 being connected to form a stack of flow distribution modules 5.

Figure 12:
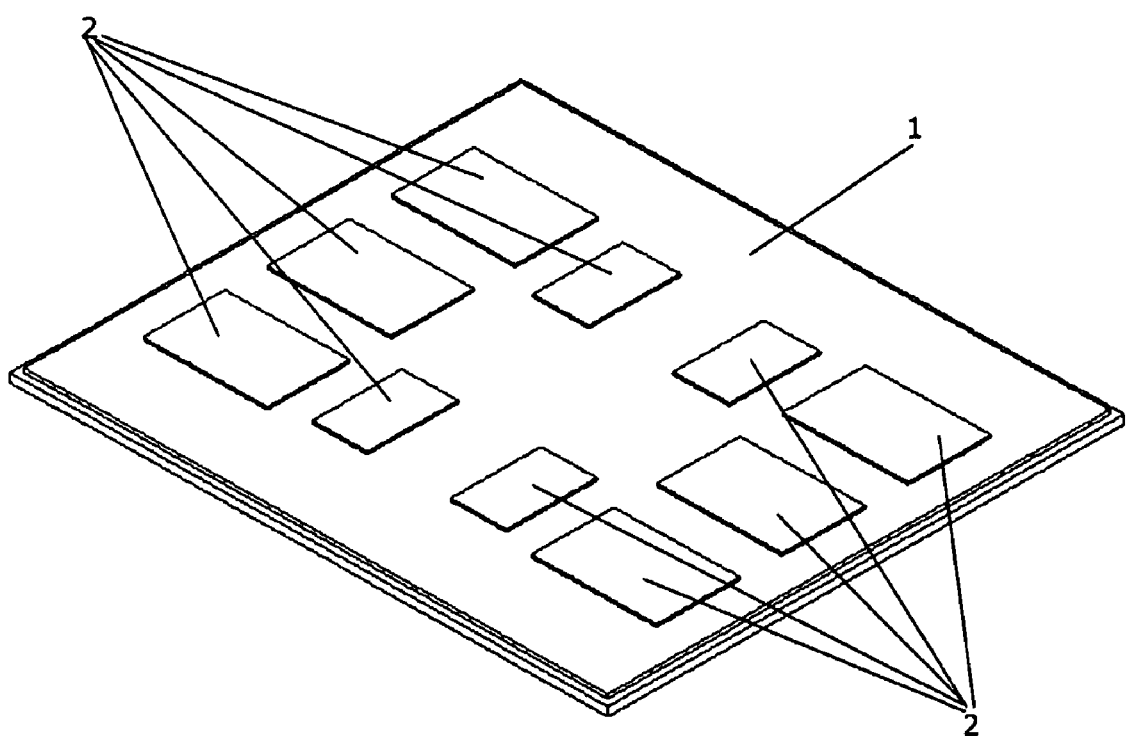
FIGS. 12-15 show sequentially the building of a substrate part for a flow distribution module according to an embodiment of the present invention.
Figure 13:
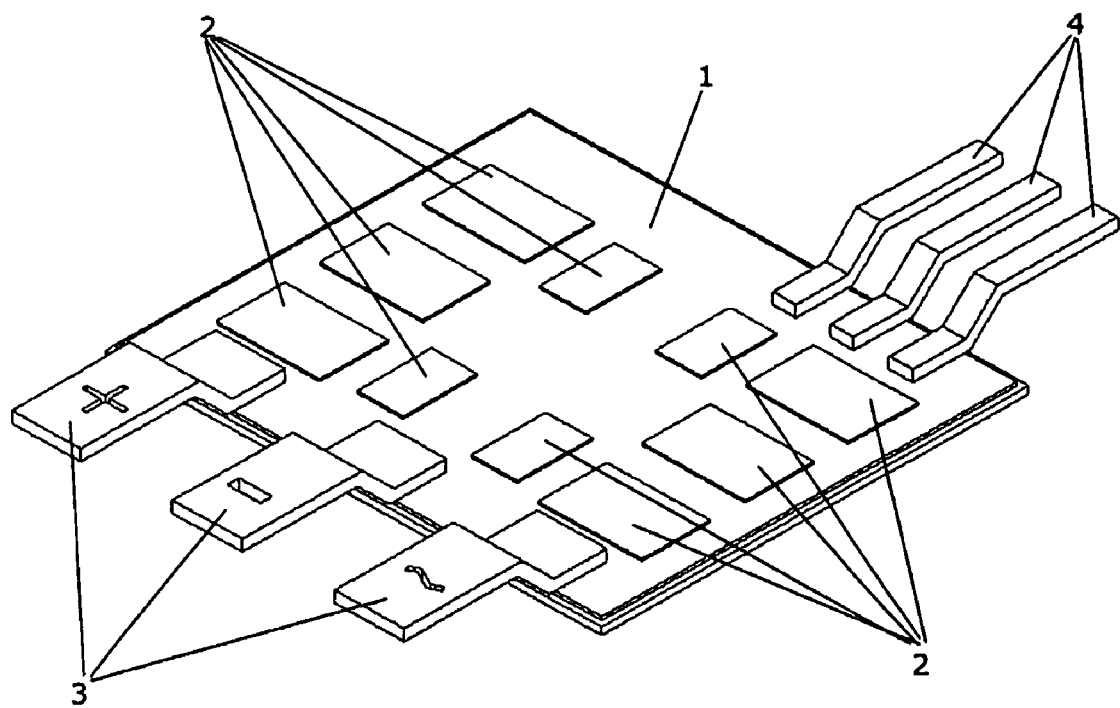

FIGS. 12-15 show sequentially the building of a substrate part 19 for a flow distribution module according to an embodiment of the present invention. FIG. 12 shows a substrate 1 having a number of components 2 arranged thereon. When building the substrate part 19 this would be an appropriate starting point. FIG. 13 shows the substrate 1 of FIG. 12, but further having three power terminals 3 and three control terminals 4 arranged thereon. Thereby FIG. 13 illustrates the next step in the process, i.e. attaching the power terminals 3 and the control terminals 4 to the substrate 1. The terminals 3, 4 may advantageously be attached by means of soldering or welding.

Figure 14:
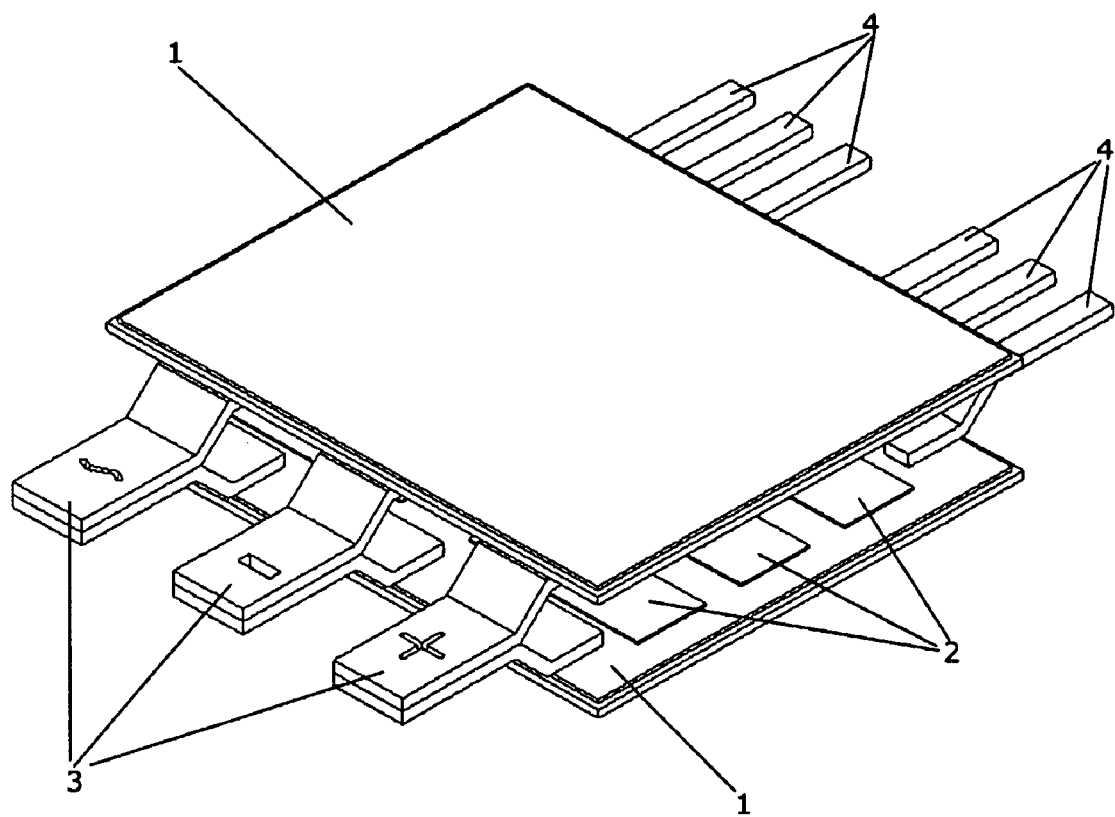
Figure 15:
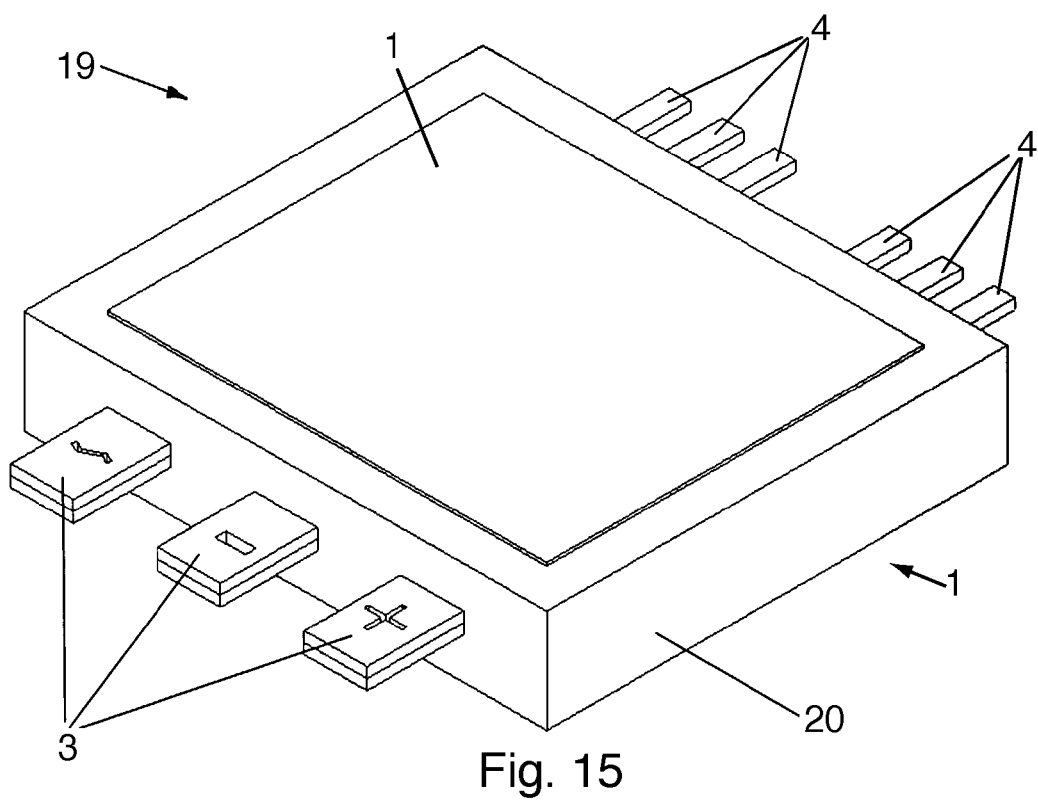

In FIG. 14 another substrate 1 has been positioned on top of and facing the original substrate 1. Thereby a 'double substrate' is provided. The two substrates 1 may be identical, but they may also be different from each other. In the latter case each substrate 1 may comprise a single switch, and the 'double substrate' might thereby form a half bridge. Such a construction would, e.g., make the 'double substrate' (or the resulting substrate part 19) very suitable for use as a 'building block', e.g. for building a three phase inverter module. In FIG. 15 the 'double substrate' has been provided with an encapsulation 20, thereby forming a substrate part 19 which is ready for being connected to a flow distribution module.

Figure 16:
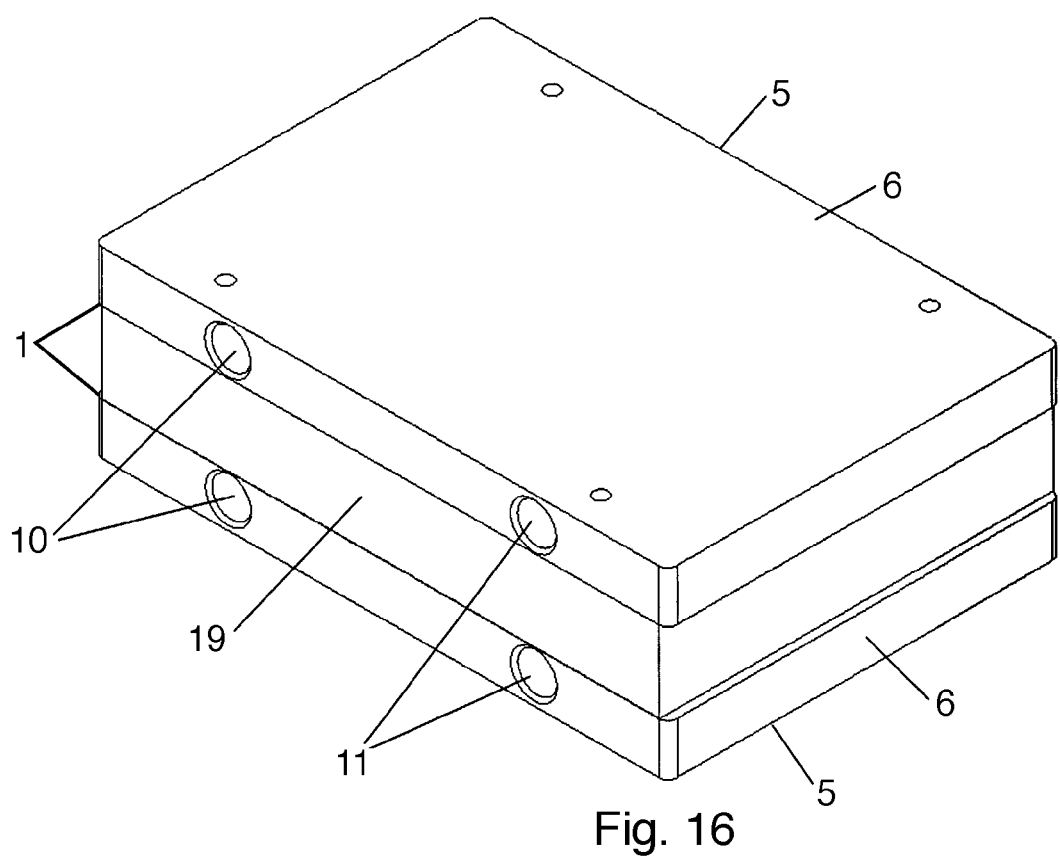
FIGS. 16 and 17 show stacks of flow distribution modules being connected via one or more substrates.

FIG. 16 shows a stack of flow distribution modules 5 according to an embodiment of the present invention. The stack comprises two flow distribution modules 5/housings 6 being connected via a substrate part 19, the substrate part 19 being arranged between the housings 6. The substrate part 19 may be of the kind illustrated in FIG. 15. However, it may also comprise just one substrate, or it may comprise three or more substrates which have been assembled, e.g. in a manner similar to the one described in connection to FIGS. 12-15. In case the substrate part 19 is of the kind shown in FIG. 15 each of the housings 6 will provide cooling for one of the substrates 1 of the substrate part 19.

Each of the housings 6 is provided with an inlet opening 10 for providing a cooling fluid to the interior of the housing 6, and an outlet opening 11 for leading the fluid away from the housing 6.

Figure 17:
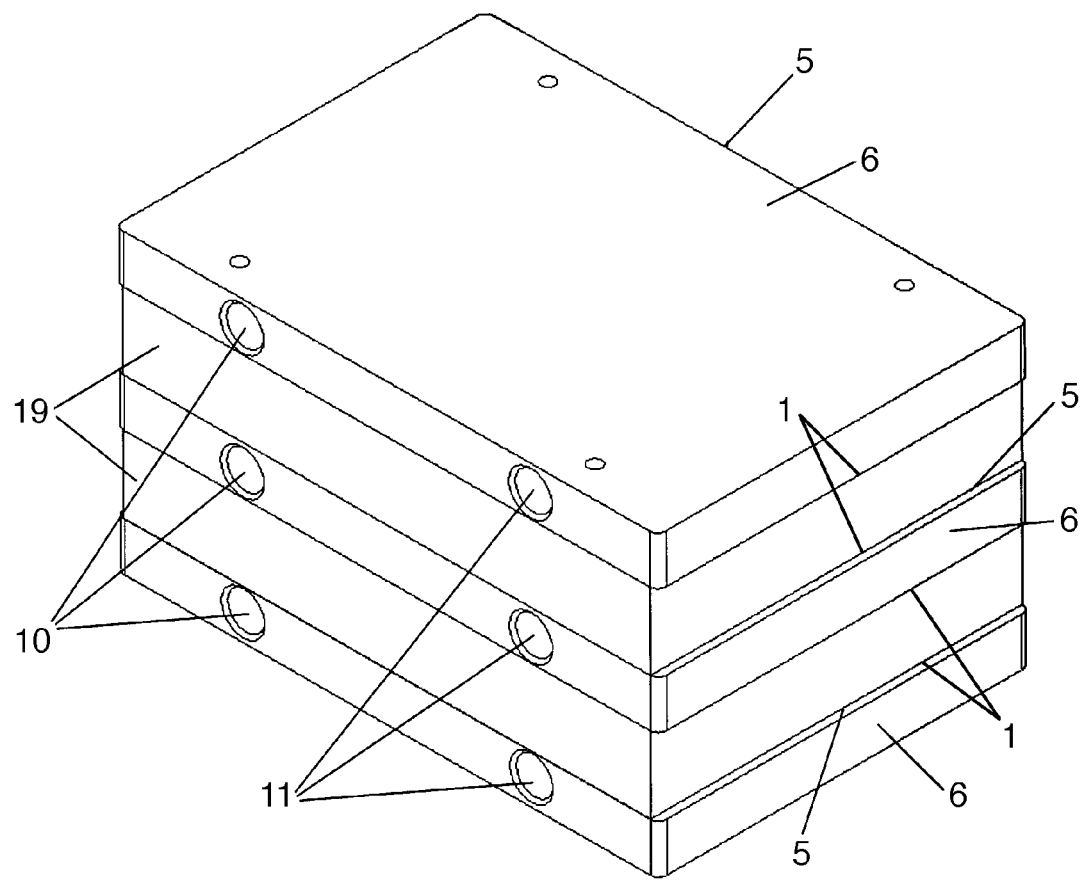

FIG. 17 shows a stack of flow distribution modules 5 according to one embodiment of the present invention. The stack comprises three housings 6 being connected via substrate parts 19 as described above. All the remarks set forth above are equally applicable here.

Figure 18:
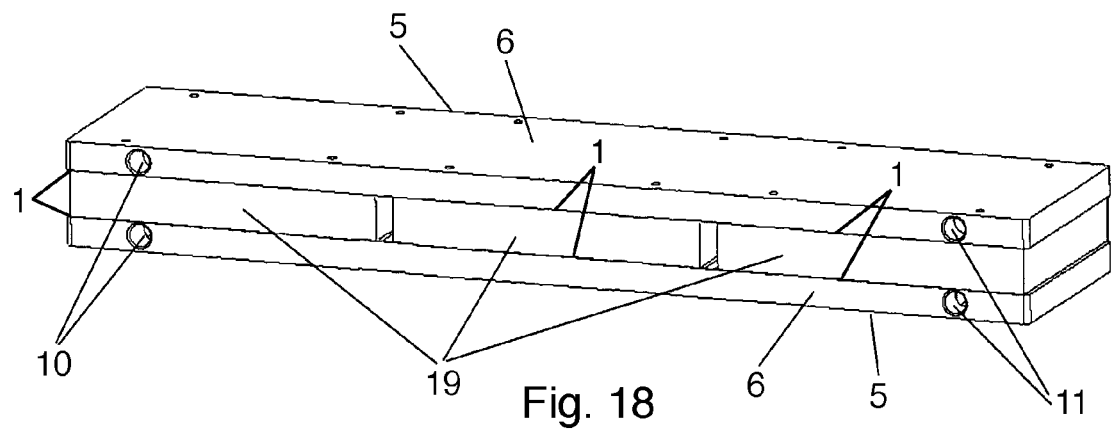
FIG. 18 shows a stack of flow distribution modules having substrate parts positioned side-by-side.

FIG. 18 shows a stack of flow distribution modules 5 comprising two housings 6 being connected via three substrate parts 19 positioned side-by-side. The substrate parts 19 may be of the kind shown in FIG. 15. The embodiment shown in FIG. 18 is very suitable for applications where several surfaces need to be cooled and a relatively flat stack is desired. Yet the stack is still compact compared to prior art cooling devices because some of the substrates are stacked. Since the housings 6 are in contact with all the substrate parts 19, cooling is provided for all the substrates by providing fluid to the two housings.

Figure 19:
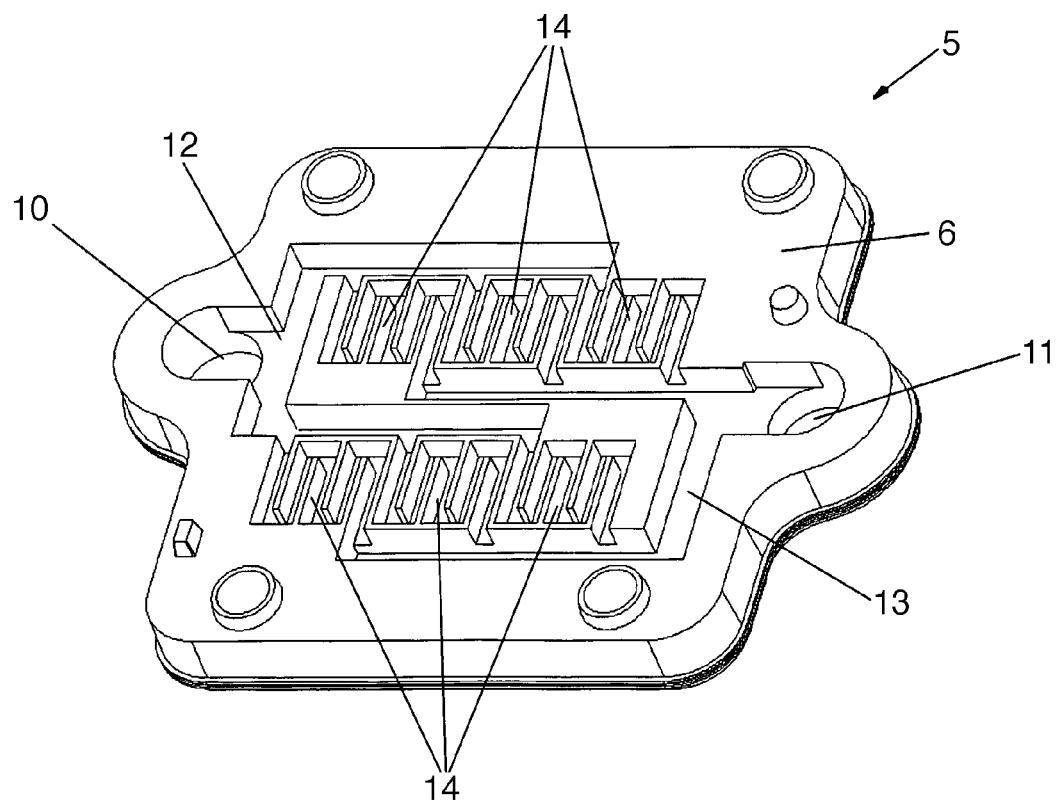
FIG. 19 shows a flow distribution module according to a second embodiment of the invention.

FIG. 19 shows a flow distribution module 5 according to a second embodiment of the invention. The flow distribution module comprises a housing 6 with an inlet opening 10, an outlet opening 11, an inlet manifold 12, and outlet manifold 13 and six flow cells 14 formed therein. Each of the flow cells 14 establishes a fluid connection between the manifolds 12, 13 as described above.

Figure 20:
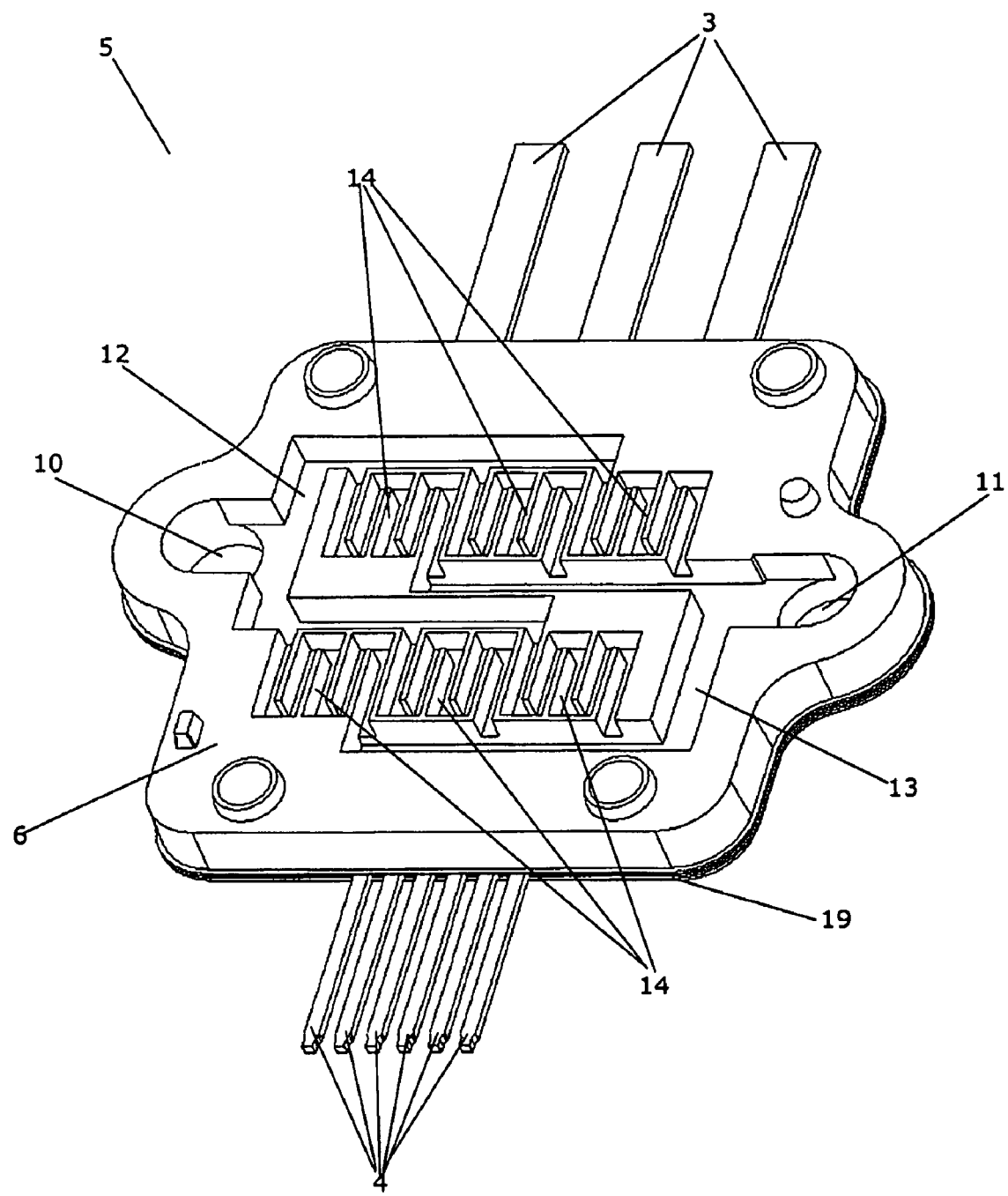
FIG. 20 shows the flow distribution module of FIG. 19 with a substrate mounted thereon.

FIG. 20 shows the flow distribution module 5 of FIG. 19 with a substrate part 19 mounted thereon in such a manner that the substrate part 19 forms an integral part of the housing 6. Three power terminals 3 and six control terminals 4 protrude from the substrate part 19. When another identical flow distribution module 5 is positioned on top of the flow distribution module 5 shown in FIG. 20, the flow cells 14 will pass a flow of fluid over the substrate part 19 of the upper flow distribution module 5, thereby providing cooling for that substrate part 19.

Figure 21:
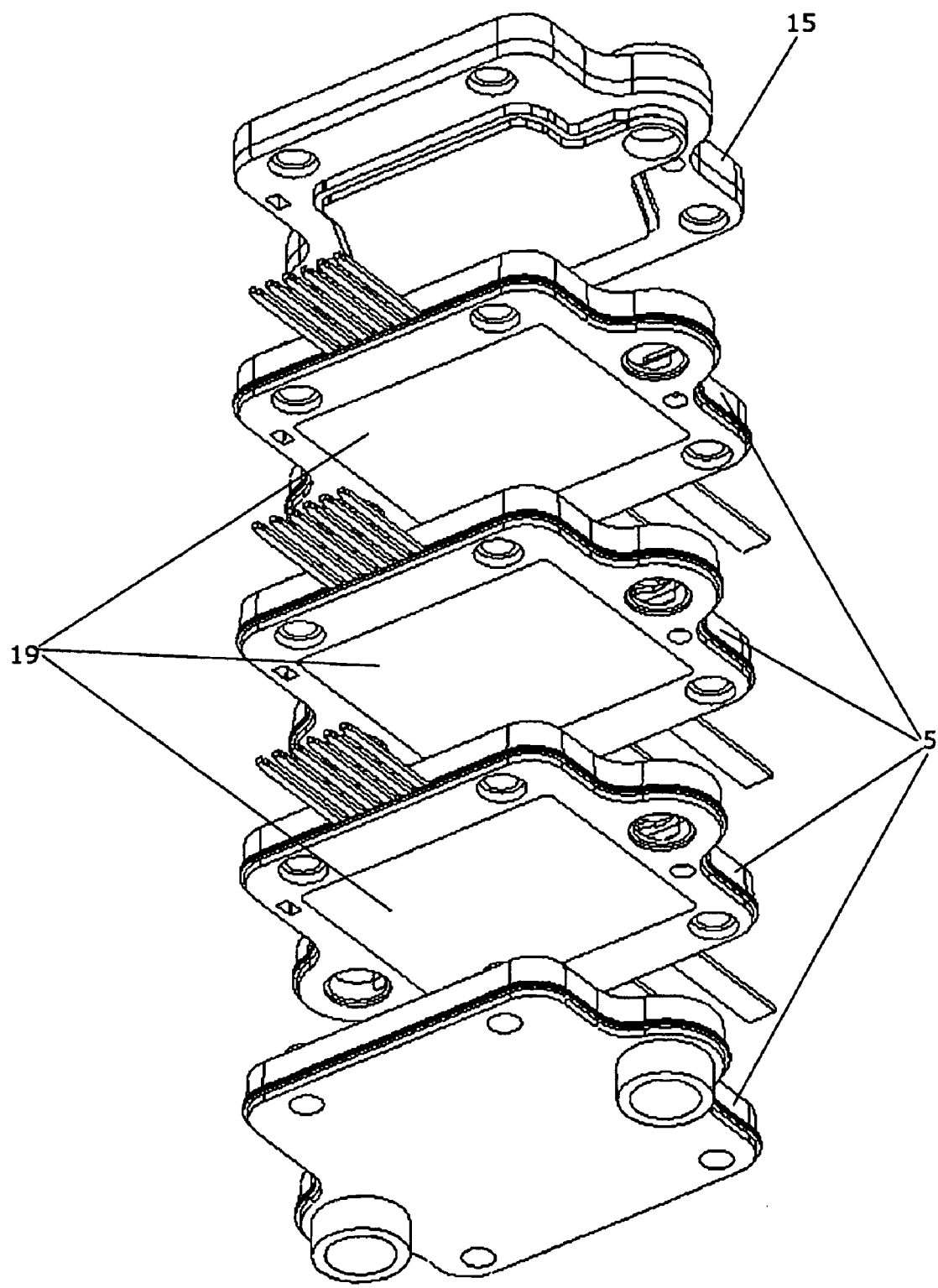
FIG. 21 is an exploded view of a stack of flow distribution modules of the kind shown in FIG. 20.

FIG. 21 is an exploded view of a stack of flow distribution modules 5 of the kind shown in FIG. 20. The stack comprises four flow distribution modules 5, three of them having a substrate part 19 mounted thereon and forming an integral part of the housing 6. The stack is ended by a lid 15. It is clear from the Figure that the substrate parts 19 are cooled by the flow cells (facing upwards and therefore not visible in the Figure) of the flow distribution module 5 positioned immediately below the respective substrate part 19 when the stack is assembled.

Figure 22:
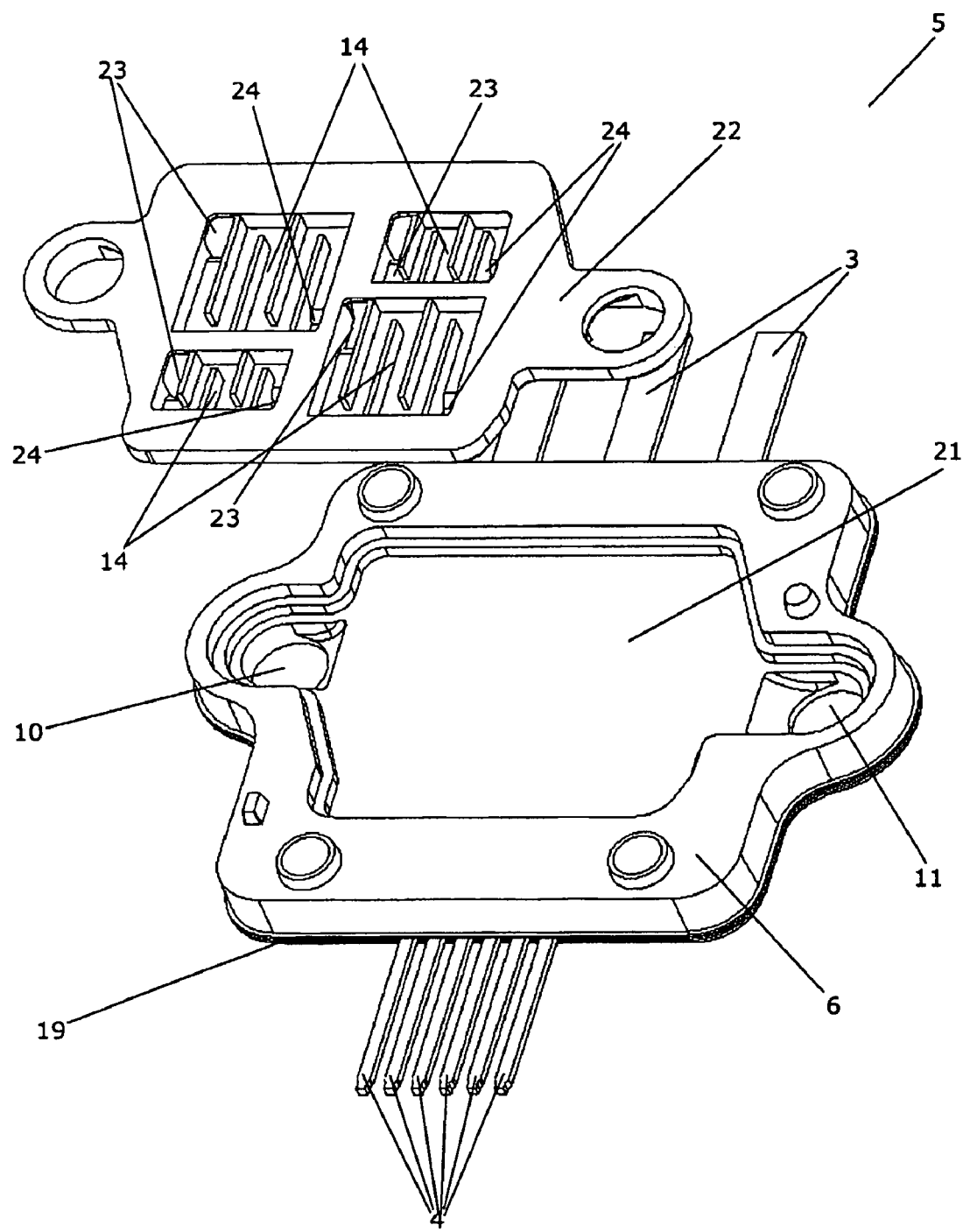
FIG. 22 is an exploded view of a flow distribution module according to a third embodiment of the invention.

FIG. 22 is an exploded view of a flow distribution module 5 according to a third embodiment of the invention with a substrate part 19 mounted thereon in such a manner that the substrate part 19 forms an integral part of a housing 6. Three power terminals 3 and six control terminals 4 protrude from the substrate part 19. The flow distribution module 5 comprises a housing 6 having an inlet opening 10, an outlet opening 11 and a cavity 21 formed therein. The cavity 21 is adapted to receive a separate baffle 22 having four flow cells 14 formed therein. On the side of the baffle 22 which faces downwards on the Figure, an inlet manifold and an outlet manifold are formed. Each of the flow cells 14 is fluidly connected to the inlet manifold via a cell inlet 23 and fluidly connected to the outlet manifold via a cell outlet 24, and each of the flow cells 14 thereby establishes a fluid connection between the inlet manifold and the outlet manifold.

Figure 23:
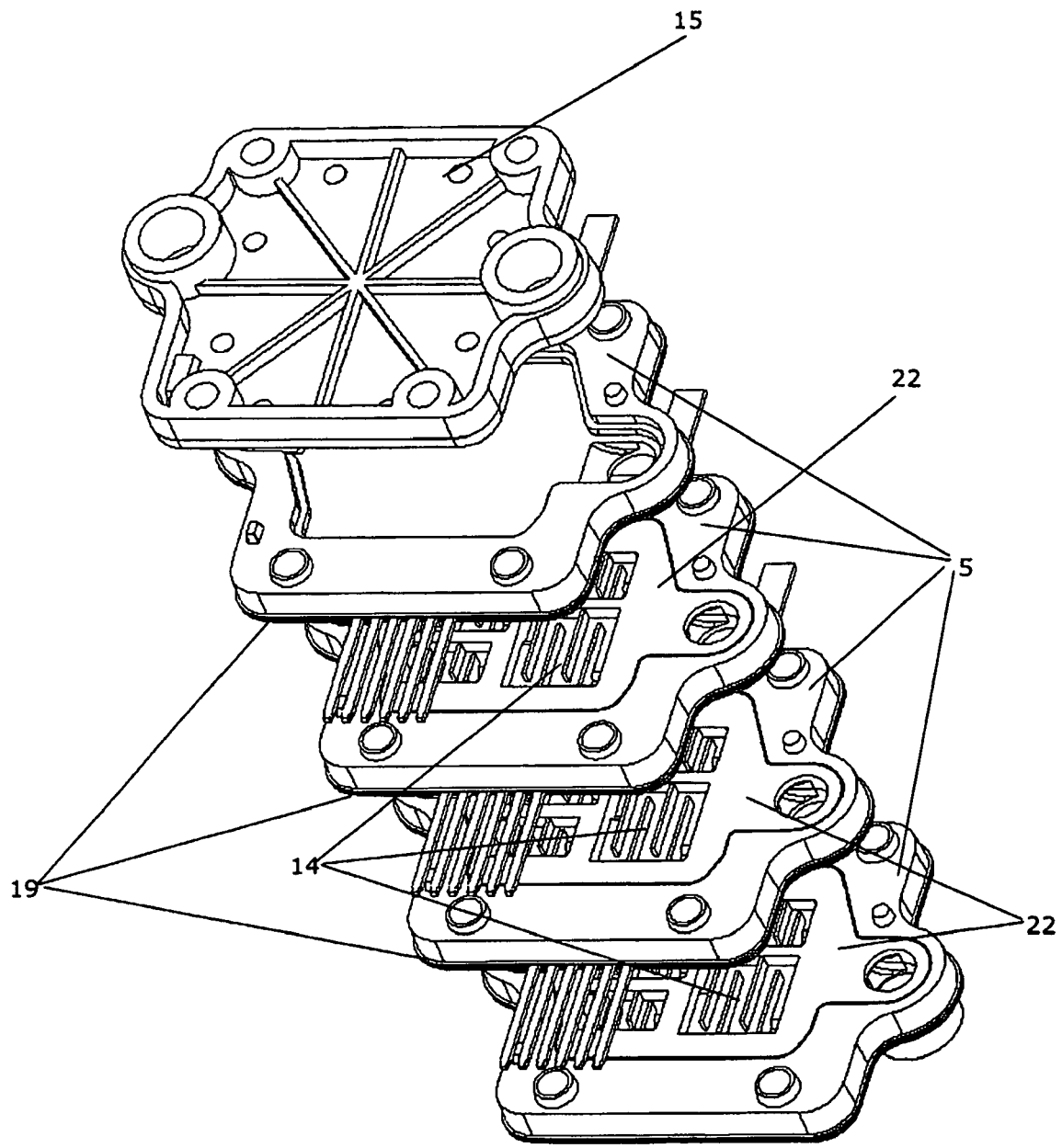
FIG. 23 is an exploded view of a stack of flow distribution modules of the kind shown in FIG. 23.

FIG. 23 is an exploded view of a stack of flow distribution modules 5 of the kind shown in FIG. 22. The stack comprises four flow distribution modules 5, three of them having a substrate part 19 mounted thereon and forming an integral part of the housing 6. The stack is ended by a lid 15. Three of the flow distribution modules 5 has the baffle 22 inserted in the cavity, and it is clear that when a flow of fluid passes through the flow cells 14 of the baffles 22, the fluid will provide cooling to a substrate part 19 positioned immediately above the baffle 22 in question.

Figure 24:
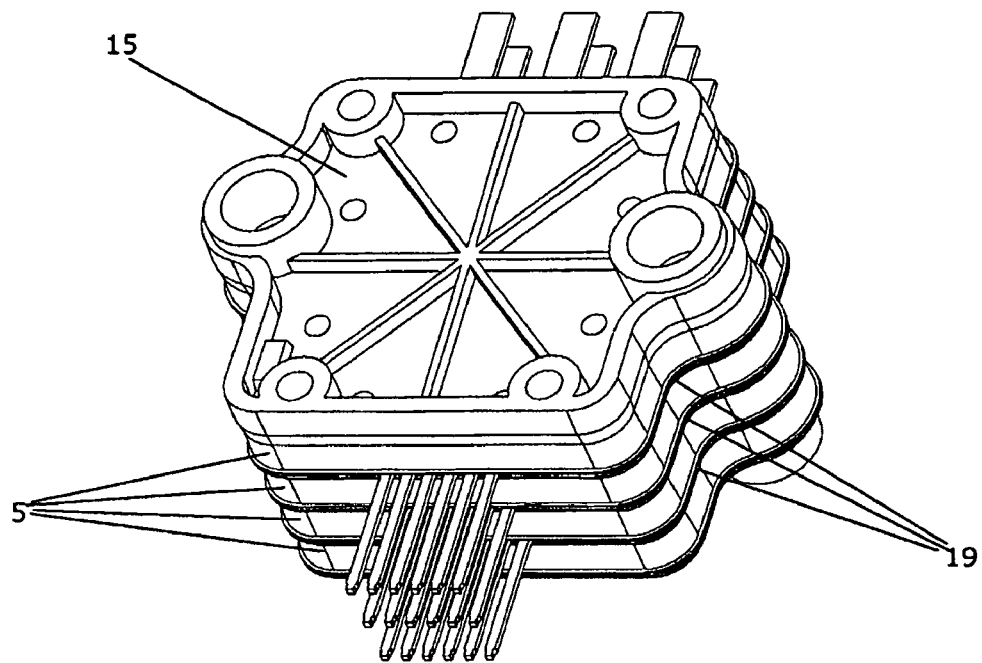
FIG. 24 shows the stack of flow distribution modules of FIG. 23.

FIG. 24 shows the stack of flow distribution modules 5 of FIG. 23. In FIG. 24 it is clear that the substrate parts 19 are positioned immediately adjacent to the flow cells.

Figure 25:
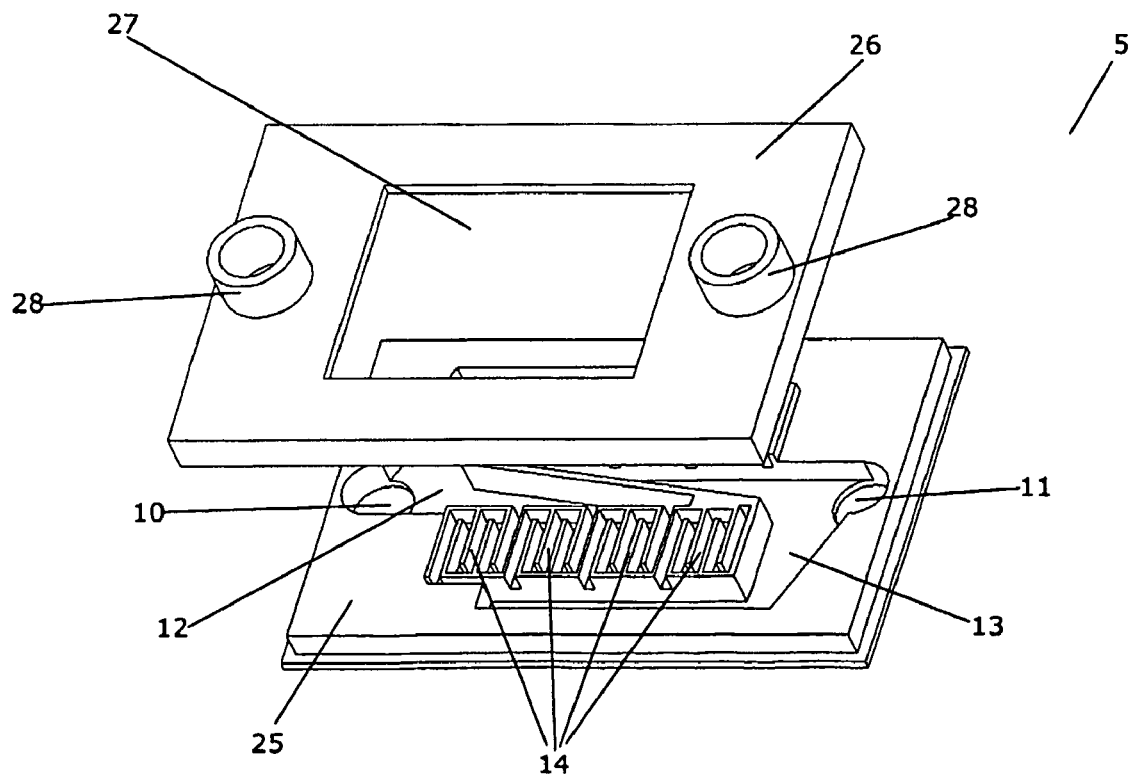
FIG. 25 is an exploded view of a flow distribution module according to a fourth embodiment of the invention.

FIG. 25 is an exploded view of a flow distribution module 5 according to a fourth embodiment of the invention. The flow distribution module 5 comprises a first part 25 having an inlet opening 10, an outlet opening 11, an inlet manifold 12, an outlet manifold 13 and a number of flow cells 14 formed therein. The flow distribution module 5 further comprises a second part 26 having an opening 27 formed therein. The second part 26 is further provided with two connector parts 28 which are used for connecting the flow distribution module 5 to another identical (or substantially identical) flow distribution module 5.

Figure 26:
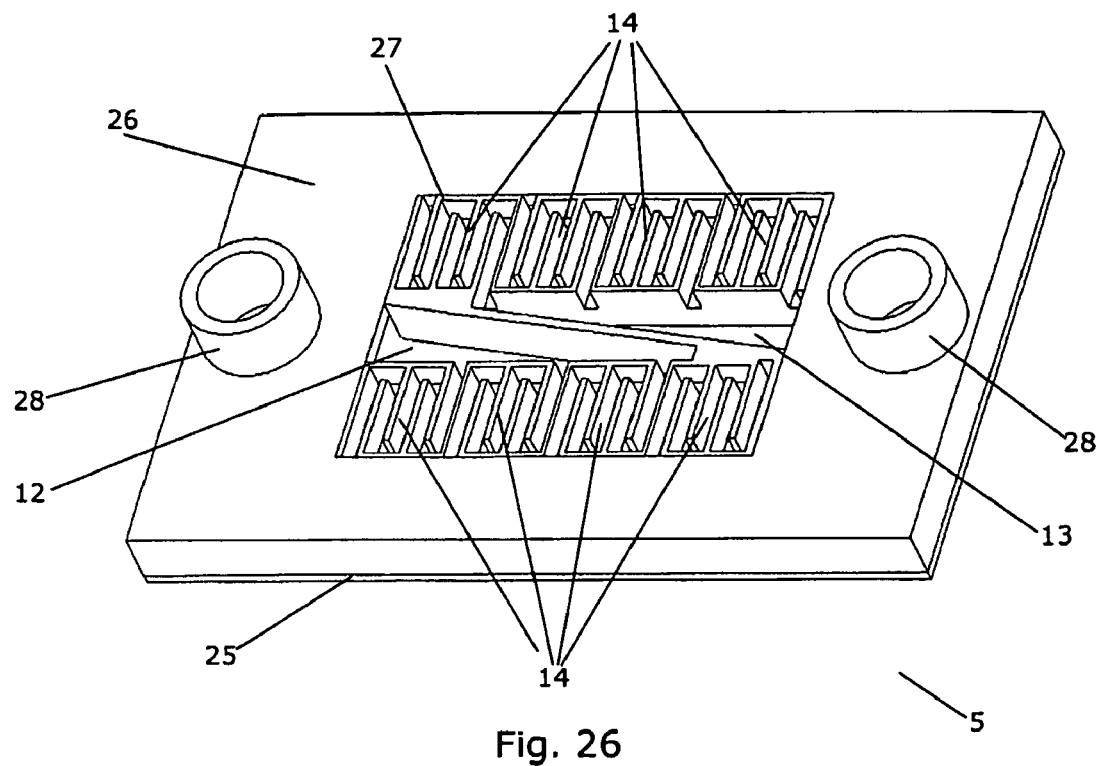
FIG. 26 shows the flow distribution module of FIG. 25.

FIG. 26 shows the flow distribution module 5 of FIG. 25. The first 25 and the second 26 parts have been assembled, and the opening 27 is positioned corresponding to the flow cells 14. Thereby the flow cells 14 may distribute a flow of fluid over a surface which can be mounted in that area.

Figure 27:
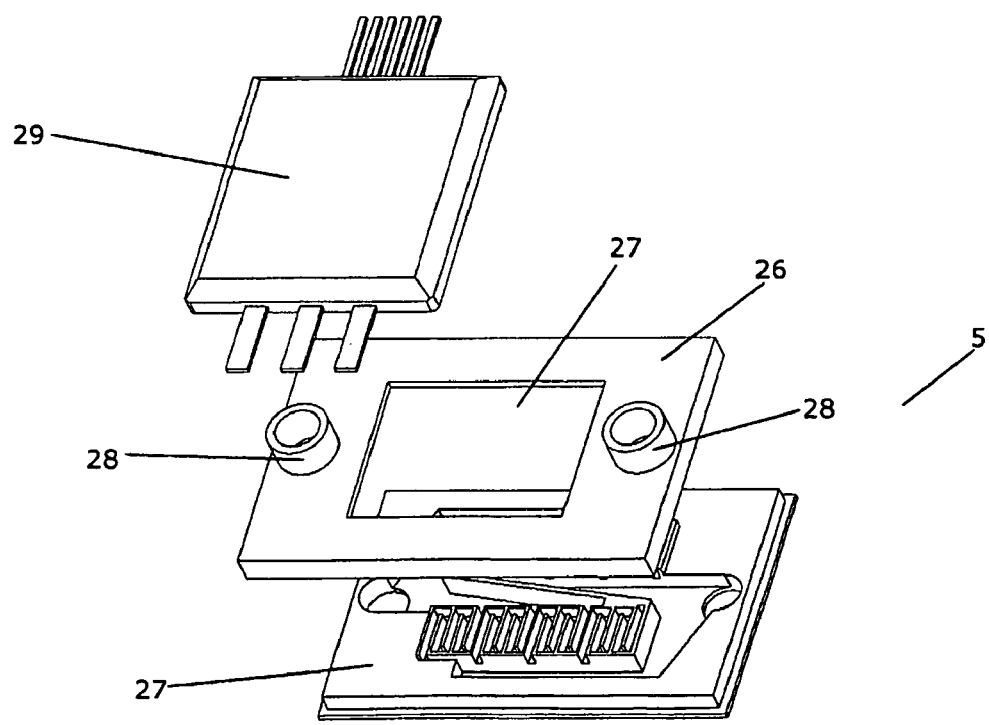
FIG. 27 is an exploded view of the flow distribution module of FIGS. 25 and 26 and a standard semiconductor module.

FIG. 27 is an exploded view of the flow distribution module 5 of FIGS. 25 and 26 and a standard semiconductor module 29. The standard semiconductor module 29 is preferably an 'off-the-shelf' kind, i.e. it is not shaped or formed with consideration to providing cooling to the module 29. The flow distribution module 5 according to this embodiment is capable of providing cooling to such a standard semiconductor module 29 by positioning the flow distribution module 5 adjacent to the standard semiconductor module 29 in such a way that a surface of the standard semiconductor module 29 covers the opening 27 of the second part 26 of the flow distribution module.

Figure 28:
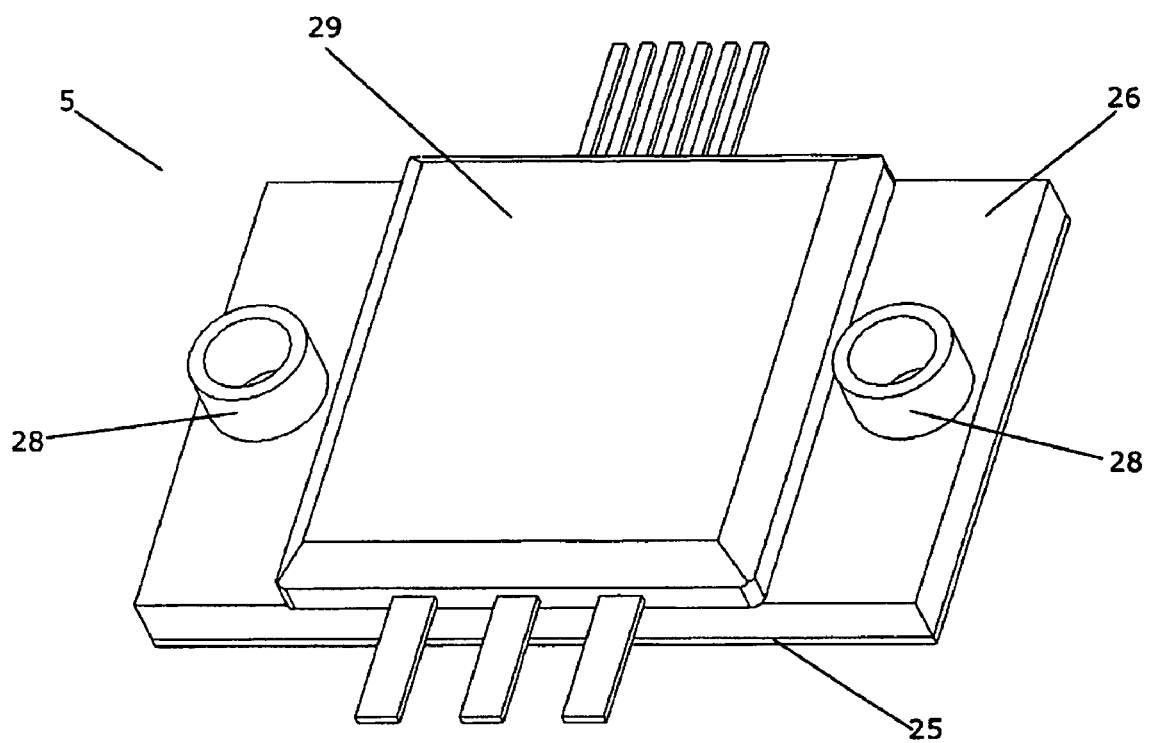
FIG. 28 is the flow distribution module and semiconductor module of FIG. 27.

FIG. 28 shows the flow distribution module 5 of FIG. 27 with the standard semiconductor module 29 positioned as described above.

Figure 29:
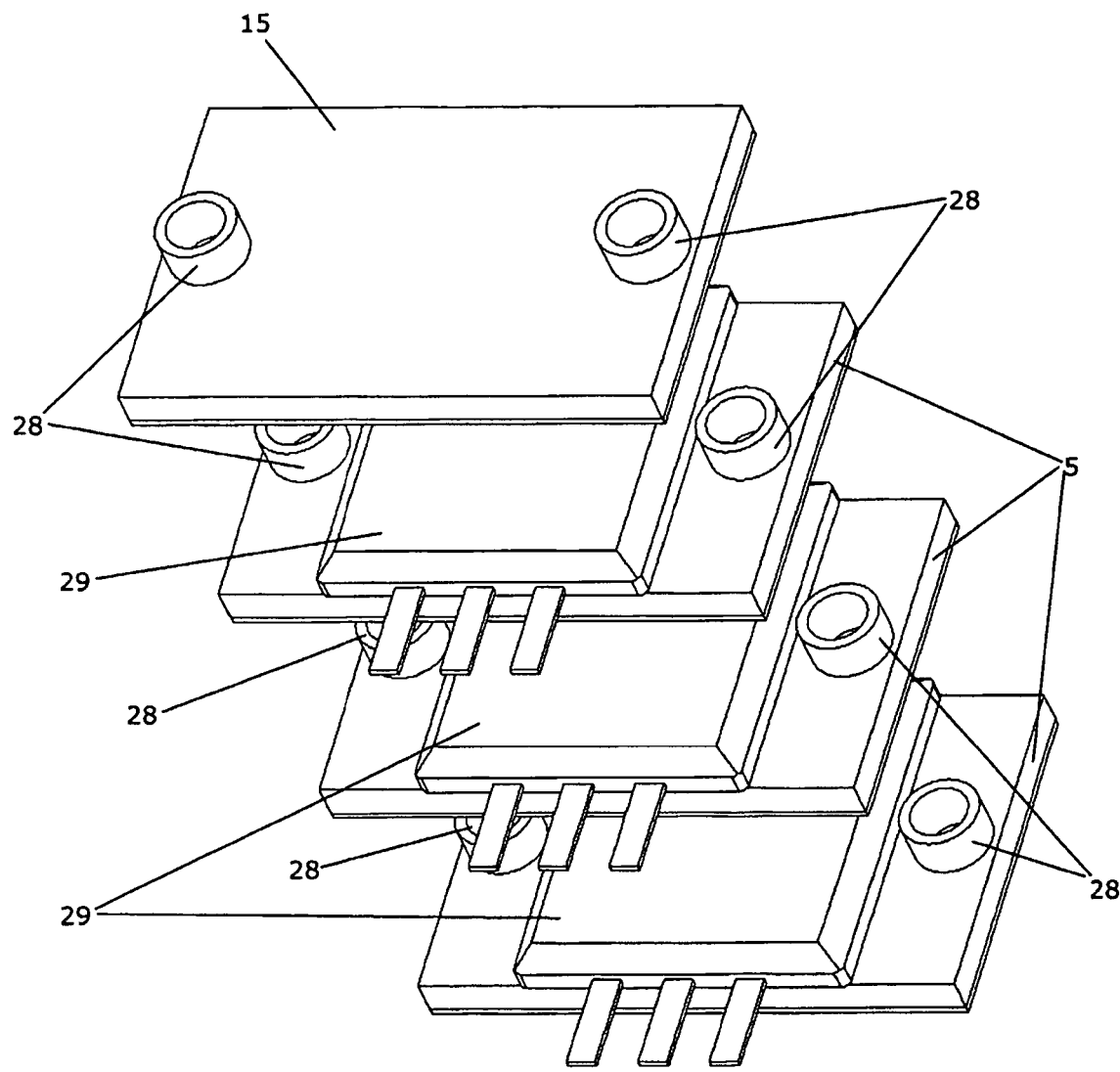
FIG. 29 is an exploded view of a stack of flow distribution modules of the kind shown in FIG. 28.

FIG. 29 is an exploded view of a stack of flow distribution modules 5 of the kind shown in FIG. 28. The stack is ended by a lid 15.

Figure 30:
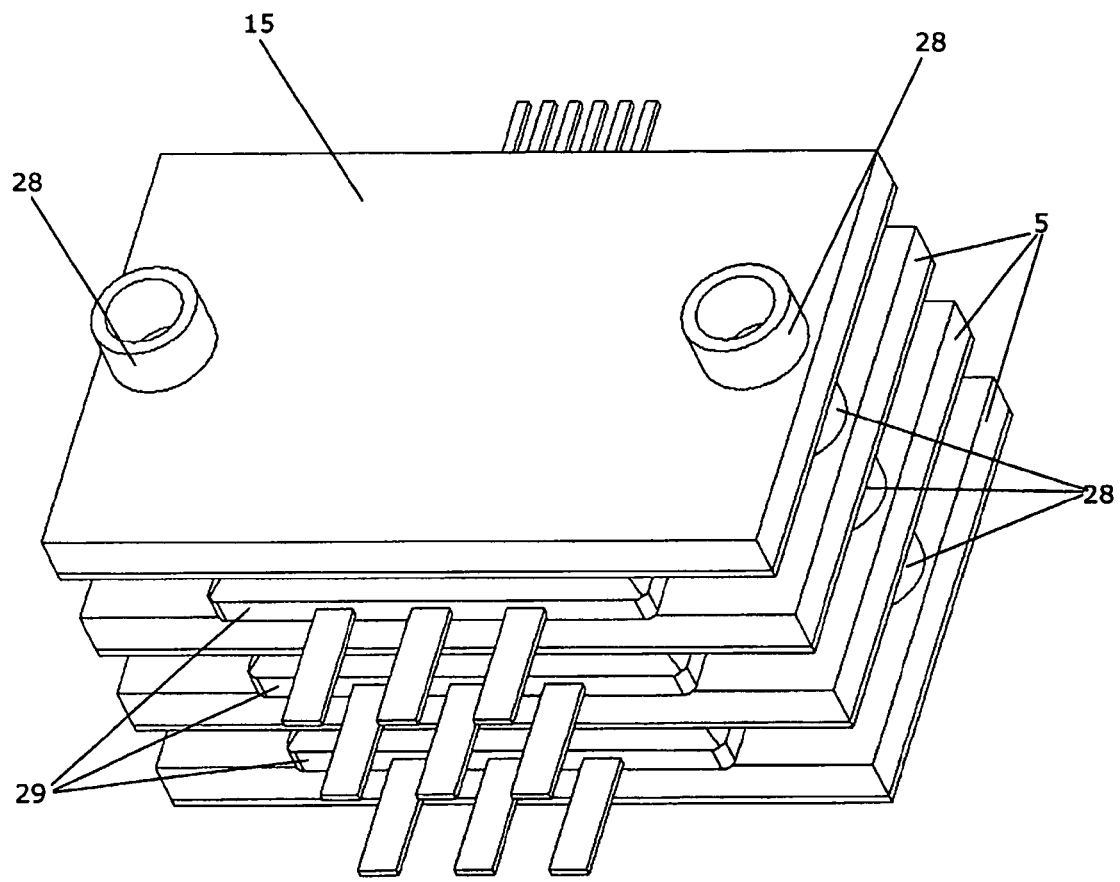
FIG. 30 is the stack of flow distribution modules of FIG. 29.

FIG. 30 shows the stack of flow distribution modules 5 of FIG. 29. The resulting stack is an alternating structure of flow distribution modules 5 and standard semiconductor modules 29. It is clear from the Figure that the connector parts 28 have been sized and shaped in such a way that the standard semiconductor module 29 fits exactly between two flow distribution modules 5 and a compact stack can therefore be formed. Thus, according to this embodiment of the invention, it is possible to design the flow distribution module 5 to be able to cool a given standard semiconductor module 29, simply by sizing and shaping the opening 27 and the connector parts 28 in an appropriate manner. This is very advantageous because the manufacturing process as well as the tooling for manufacturing the standard semiconductor module 29 in most cases is far more expensive than the manufacturing process and the tooling for manufacturing the flow distribution module 5. It is therefore desirable to be able to provide cooling for a semiconductor module 29 without having to customize the semiconductor module 29 according to the flow distribution module 5.

While the present invention has been illustrated and described with respect to a particular embodiment thereof, it should be appreciated by those of ordinary skill in the art that various modifications to this invention may be made without departing from the spirit and scope of the present invention.

The invention claimed is:

1. A flow distribution module for distributing a flow of fluid over at least one surface to be cooled, the flow distribution module comprising:
    a housing,
    an inlet manifold,
    an outlet manifold,
    a plurality of flow cells establishing one or more fluid connections between the inlet manifold and the outlet manifold, the flow cells being positioned in such a way that a flow of fluid passes along the surface(s) to be cooled when fluid flows from the inlet manifold to the outlet manifold via at least one flow cell,
    a substrate having one or more surfaces to be cooled,
    an inlet opening for providing fluid to the inlet manifold, and
    an outlet opening for leading fluid away from the outlet manifold, the flow distribution module being adapted to be connected to another at least substantially identical flow distribution module in such a manner that the inlet opening is connected to another at least substantially identical inlet opening to form a common fluid inlet, and in such a manner that the outlet opening is connected to another at least substantially identical outlet opening to form a common fluid outlet, the flow distribution module thereby being adapted to form part of a stack of flow distribution modules, wherein the flow distribution module is adapted to be connected to another at least substantially identical flow distribution module via one or more substrates, each substrate having one or more surfaces to be cooled.

2. A flow distribution module for distributing a flow of fluid over at least one surface to be cooled, the flow distribution module comprising:
    a housing,
    an inlet manifold,
    an outlet manifold,
    a plurality of flow cells establishing one or more fluid connections between the inlet manifold and the outlet manifold, the flow cells being positioned in such a way that a flow of fluid passes along the surface(s) to be cooled when fluid flows from the inlet manifold to the outlet manifold via at least one flow cell,
    a substrate having one or more surfaces to be cooled,
    an inlet opening for providing fluid to the inlet manifold, and
    an outlet opening for leading fluid away from the outlet manifold, the flow distribution module being adapted to be connected to another at least substantially identical flow distribution module in such a manner that the inlet opening is connected to another at least substantially identical inlet opening to form a common fluid inlet, and in such a manner that the outlet opening is connected to another at least substantially identical outlet opening to form a common fluid outlet, the flow distribution module thereby being adapted to form part of a stack of flow distribution modules, wherein the housing comprises a first side with a surface to be cooled forming an integral part thereof and a second side being adapted to accommodate a baffle having at least the plurality of flow cells formed therein, the plurality of flow cells thereby being adapted to provide a flow of fluid across a surface to be cooled which forms an integral part of the first side of a neighbouring flow distribution module; and
wherein the baffle further has the inlet manifold and the outlet manifold formed therein.

3. A stack of flow distribution modules for distributing a flow of fluid over at least one surface to be cooled, each flow distribution module of the stack comprising:
    a housing,
    an inlet manifold,
    an outlet manifold,
    a plurality of flow cells establishing one or more fluid connections between the inlet manifold and the outlet manifold, the flow cells being positioned in such a way that a flow of fluid passes along the surface(s) to be cooled when fluid flows from the inlet manifold to the outlet manifold via at least one flow cell,
    a substrate having one or more surfaces to be cooled,
    an inlet opening for providing fluid to the inlet manifold, and
    an outlet opening for leading fluid away from the outlet manifold, the flow distribution module being adapted to be connected to another at least substantially identical flow distribution module in such a manner that the inlet opening is connected to another at least substantially identical inlet opening to form a common fluid inlet, and in such a manner that the outlet opening is connected to another at least substantially identical outlet opening to form a common fluid outlet, the flow distribution module thereby being adapted to form part of a stack of flow distribution modules, wherein at least two flow distribution modules have been connected via one or more substrates.

4. The stack of flow distribution modules according to claim 3, further comprising a common fluid inlet for providing fluid to the inlet manifolds of the flow distribution modules, and a common fluid outlet for receiving fluid from the outlet manifolds of the flow distribution modules, said common fluid inlet being formed by inlet openings of the flow distribution modules, and said common fluid outlet being formed by outlet openings of the flow distribution modules.

5. The stack of flow distribution modules according to claim 4, wherein the flow distribution modules are connected in parallel between the common fluid inlet and the common fluid outlet.

6. The stack of flow distribution modules according to claim 3, wherein at least two flow distribution modules have been connected directly to each other in such a way that a substrate forming part of a standard component is retained by two flow distribution modules.

7. A stack of flow distribution modules for distributing a flow of fluid over at least one surface to be cooled, each flow distribution module of the stack comprising:
  a housing,
  an inlet manifold,
  an outlet manifold,
  a plurality of flow cells establishing one or more fluid connections between the inlet manifold and the outlet manifold, the flow cells being positioned in such a way that a flow of fluid passes along the surface(s) to be cooled when fluid flows from the inlet manifold to the outlet manifold via at least one flow cell,
  a substrate having one or more surfaces to be cooled,
  an inlet opening for providing fluid to the inlet manifold, and
  an outlet opening for leading fluid away from the outlet manifold, the flow distribution module being adapted to be connected to another at least substantially identical flow distribution module in such a manner that the inlet opening is connected to another at least substantially identical inlet opening to form a common fluid inlet, and in such a manner that the outlet opening is connected to another at least substantially identical outlet opening to form a common fluid outlet, the flow distribution module thereby being adapted to form part of a stack of flow distribution modules, wherein at least two modules have been connected in such a way that the substrates face each other.

* * * * *